(12) United States Patent
Kato et al.

(10) Patent No.: US 9,865,454 B2
(45) Date of Patent: Jan. 9, 2018

(54) SUBSTRATE PROCESSING APPARATUS AND SUBSTRATE PROCESSING METHOD

(71) Applicant: Tokyo Electron Limited, Tokyo (JP)

(72) Inventors: Hitoshi Kato, Iwate (JP); Hiroyuki Kikuchi, Iwate (JP); Masato Yonezawa, Iwate (JP); Jun Sato, Iwate (JP); Shigehiro Miura, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 6 days.

(21) Appl. No.: 14/522,711

(22) Filed: Oct. 24, 2014

(65) Prior Publication Data

US 2015/0126044 A1  May 7, 2015

(30) Foreign Application Priority Data

Nov. 6, 2013  (JP) ................................. 2013-230080

(51) Int. Cl.
| | |
|---|---|
| *H01L 21/67* | (2006.01) |
| *H01L 21/02* | (2006.01) |
| *C23C 16/458* | (2006.01) |
| *C23C 16/505* | (2006.01) |
| *C23C 16/455* | (2006.01) |

(Continued)

(52) U.S. Cl.
CPC .... *H01L 21/02211* (2013.01); *C23C 16/4584* (2013.01); *C23C 16/45538* (2013.01); *C23C 16/45551* (2013.01); *C23C 16/505* (2013.01); *H01J 37/3244* (2013.01); *H01J 37/32513* (2013.01); *H01J 37/32568* (2013.01); *H01L 21/0228* (2013.01); *H01L 21/02164* (2013.01);

(Continued)

(58) Field of Classification Search
USPC ......................................................... 118/719
See application file for complete search history.

(56) References Cited

U.S. PATENT DOCUMENTS

| | | | | |
|---|---|---|---|---|
| 5,314,726 A | * | 5/1994 | Kurihara | C23C 16/276 423/446 |
| 6,254,747 B1 | * | 7/2001 | Hoshino | C23C 14/358 204/298.06 |

(Continued)

FOREIGN PATENT DOCUMENTS

| | | | | |
|---|---|---|---|---|
| JP | S54-059878 | | 5/1975 | |
| JP | 54059878 A | * | 5/1979 | ............. C32C 16/50 |

(Continued)

*Primary Examiner* — Gordon Baldwin
*Assistant Examiner* — Charlee J C Bennett
(74) *Attorney, Agent, or Firm* — IPUSA, PLLC

(57) ABSTRACT

A substrate processing apparatus includes a vacuum chamber including a top plate, a rotary table rotatably disposed in the vacuum chamber, a first process gas supply part that supplies a first process gas to be adsorbed on a surface of a substrate placed on the rotary table, a plasma processing gas supply part that is disposed apart from the first process gas supply part in a circumferential direction of the rotary table and supplies a second process gas to the surface of the substrate, a separation gas supply part that supplies a separation gas for separating the first process gas and the second process gas, a plasma generator that converts the second process gas into plasma, and an elevating mechanism that moves at least one of the plasma generator and the rotary table upward and downward.

8 Claims, 15 Drawing Sheets

(51) Int. Cl.
*H01J 37/32* (2006.01)
*H01L 21/311* (2006.01)

(52) U.S. Cl.
CPC .. *H01L 21/02219* (2013.01); *H01L 21/02274* (2013.01); *H01L 21/31138* (2013.01)

(56) References Cited

U.S. PATENT DOCUMENTS

| | | | | |
|---|---|---|---|---|
| 6,490,994 | B1* | 12/2002 | Yoshizawa | C23C 16/452 118/723 E |
| 2002/0038688 | A1* | 4/2002 | Nakano | C23C 16/5096 156/345.12 |
| 2005/0005859 | A1* | 1/2005 | Koshiishi | H01J 37/32642 118/728 |
| 2006/0231031 | A1* | 10/2006 | Dings | C23C 16/04 118/723 R |
| 2010/0043975 | A1* | 2/2010 | Hayashi | H01J 37/3244 156/345.33 |
| 2011/0290419 | A1* | 12/2011 | Horiguchi | H01J 37/3244 156/345.29 |
| 2013/0012028 | A1* | 1/2013 | Stern | C09K 13/04 438/753 |
| 2013/0047923 | A1* | 2/2013 | Kato | H01L 21/02164 118/723 AN |
| 2013/0276983 | A1 | 10/2013 | Park et al. | |

FOREIGN PATENT DOCUMENTS

| | | | |
|---|---|---|---|
| JP | H09-097786 | 4/1997 | |
| JP | 2000-500188 | 1/2000 | |
| JP | 2010-219105 | 9/2010 | |
| JP | 2013-161874 | 8/2013 | |
| WO | 98/02597 | 1/1998 | |
| WO | WO 9802597 A1 * | 1/1998 | ......... C23C 14/3407 |
| WO | 2012/096529 | 7/2012 | |

* cited by examiner

SUBSTRATE PROCESSING APPARATUS AND SUBSTRATE PROCESSING METHOD

CROSS-REFERENCE TO RELATED APPLICATION

The present application is based upon and claims the benefit of priority of Japanese Patent Application No. 2013-230080, filed on Nov. 6, 2013, the entire contents of which are incorporated herein by reference.

BACKGROUND OF THE INVENTION

1. Field of the Invention

An aspect of this disclosure relates to a substrate processing apparatus and a substrate processing method.

2. Description of the Related Art

In a semiconductor device production process, a film deposition process is performed on a semiconductor wafer (which is hereafter referred to as a "wafer") according to a deposition method such as atomic layer deposition (ALD).

Research and development of a rotary-table film deposition apparatus for performing ALD have been conducted in these years. A rotary-table film deposition apparatus includes a rotary table rotatably disposed in a vacuum chamber. The rotary table has recesses where wafers are placed. The recesses have a diameter that is slightly greater than the diameter of the wafers. Above the rotary table, a supply area to which a reaction gas A is supplied, a supply area to which a reaction gas B is supplied, and a separation area for separating the supply areas are defined.

Also, Japanese Laid-Open Patent Publication No. 2013-161874, for example, discloses a rotary-table film deposition apparatus including a plasma generator. The disclosed rotary-table film deposition apparatus uses plasma generated by the plasma generator to form various films (functional films) on a substrate, modify a film formed on a substrate and including carbon, and etch a film formed on a substrate.

However, with the rotary-table film deposition apparatus disclosed by Japanese Laid-Open Patent Publication No. 2013-161874, it is difficult to control the intensity of active species generated by plasma and therefore difficult to obtain a film with desired quality.

SUMMARY OF THE INVENTION

According to an aspect of this disclosure, there is provided a substrate processing apparatus that includes a vacuum chamber including a top plate; a rotary table rotatably disposed in the vacuum chamber and including a substrate mounting area on which a substrate is to be placed, the substrate mounting area being formed on a surface of the rotary table that faces the top plate; a first process gas supply part that is disposed between the top plate and the rotary table and supplies a first process gas to be adsorbed on a surface of the substrate; a plasma processing gas supply part that is disposed between the top plate and the rotary table apart from the first process gas supply part in a circumferential direction of the rotary table, and supplies a second process gas to the surface of the substrate; a separation gas supply part that is disposed between the top plate and the rotary table and between the first process gas supply part and the plasma processing gas supply part, and supplies a separation gas for separating the first process gas and the second process gas; a plasma generator that converts the second process gas into plasma; and an elevating mechanism that moves at least one of the plasma generator and the rotary table upward and downward.

DESCRIPTION OF THE PREFERRED EMBODIMENTS

Embodiments of the present invention are described below with reference to the accompanying drawings.

<Configuration of Substrate Processing Apparatus>

Figure 1:
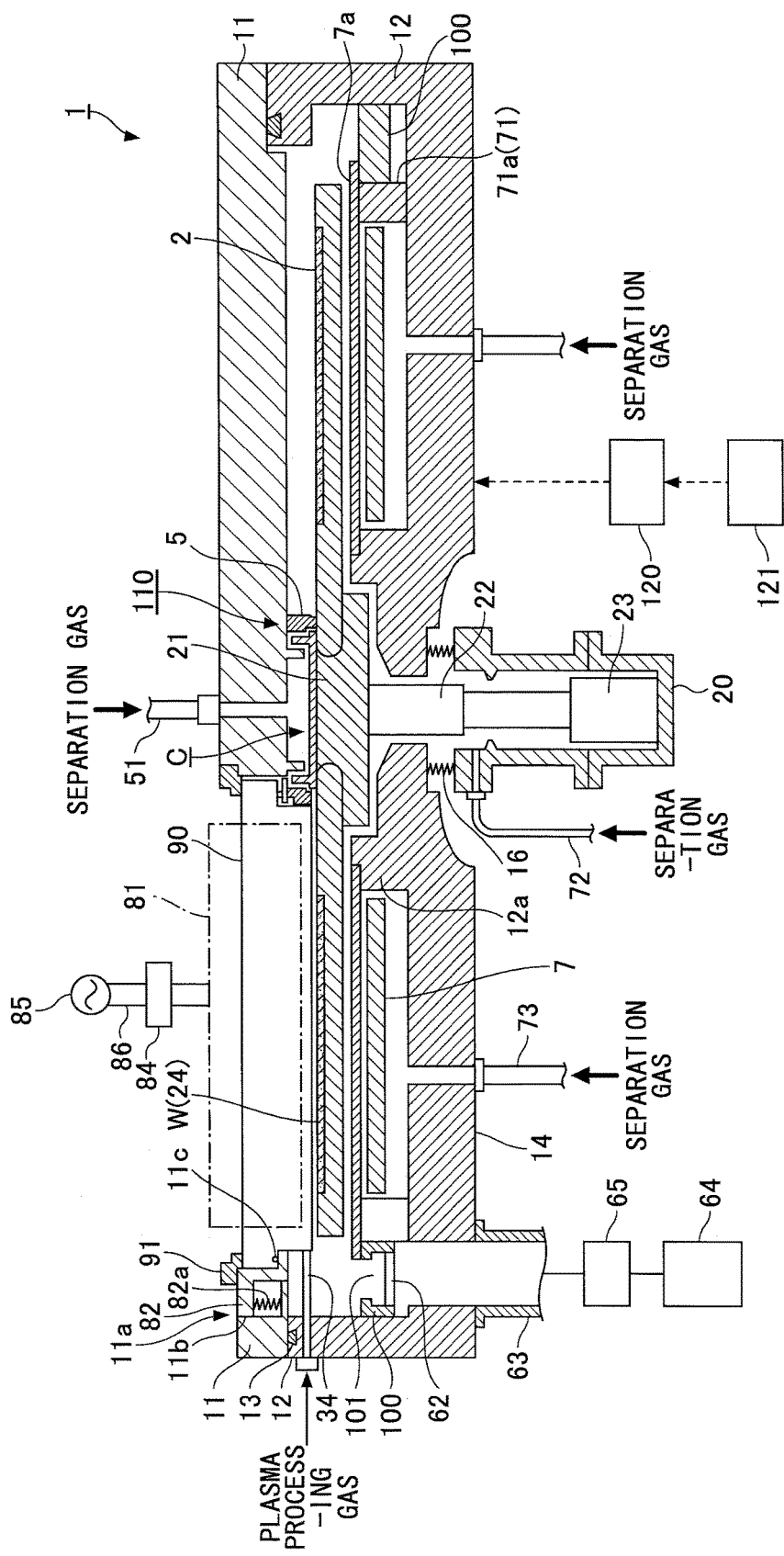
FIG. 1 is a cut-away side view illustrating an exemplary configuration of a substrate processing apparatus.
Figure 2:
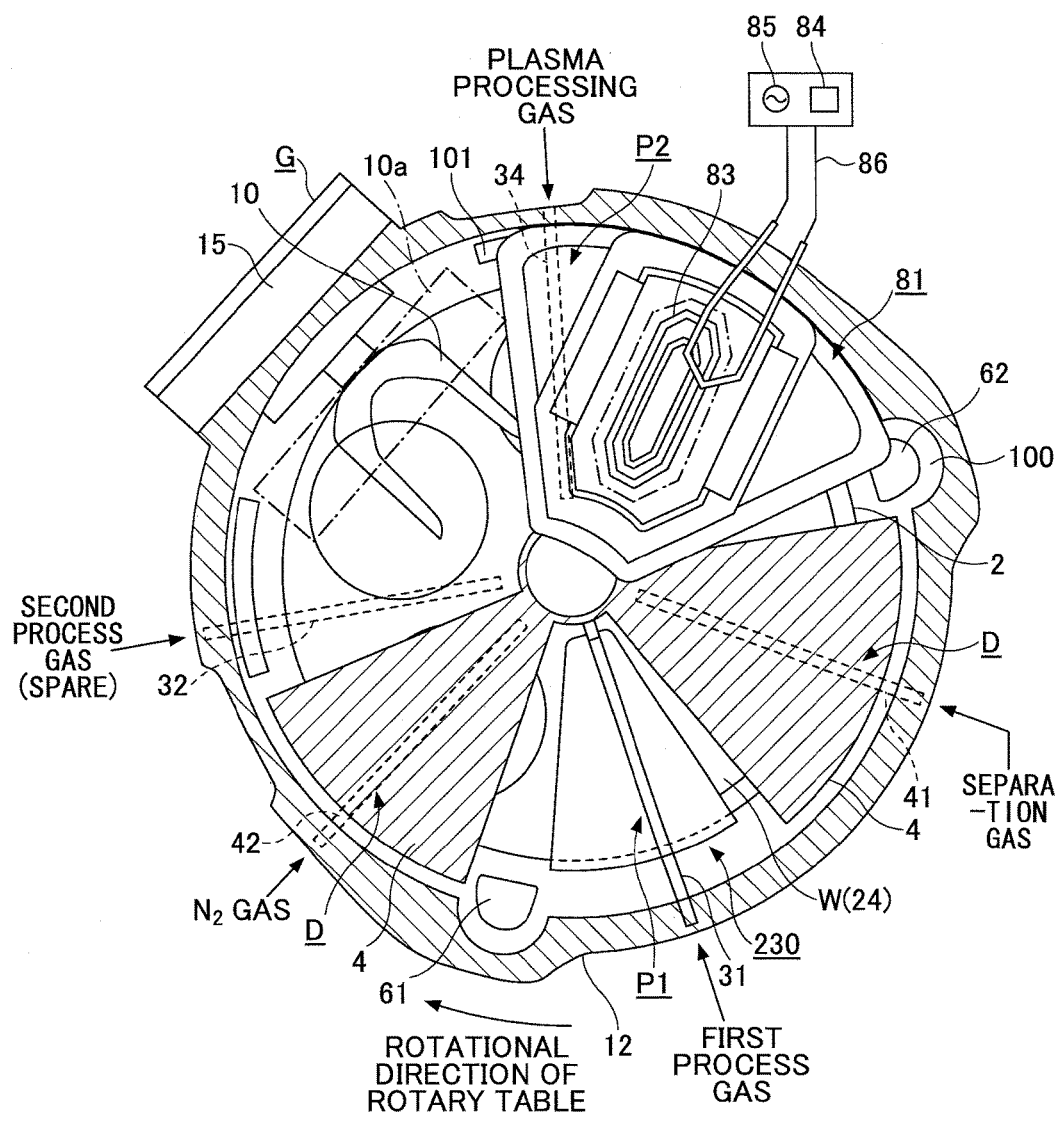
FIG. 2 is a plan view illustrating an exemplary configuration of a substrate processing apparatus.

FIG. 1 is a cut-away side view illustrating an exemplary configuration of a substrate processing apparatus according to an embodiment. FIG. 2 is a plan view illustrating an exemplary configuration of the substrate processing apparatus according to the embodiment. In FIG. 2, for descriptive purposes, a top plate 11 is omitted.

As illustrated by FIG. 1, the substrate processing apparatus of the present embodiment includes a vacuum chamber 1 having a substantially circular planar shape, and a rotary table 2 that is disposed in the vacuum chamber 1 such that the center of the vacuum chamber 1 becomes the center of rotation of the rotary table 2. The rotary table 2 rotates wafers W placed thereon around the center of the vacuum chamber 1.

The vacuum chamber 1 includes a top plate (ceiling) 11 that faces recesses 24 formed on the rotary table 2, and a chamber body 12. A ring-shaped sealing part 13 is provided at the periphery of the upper surface of the chamber body 12. The top plate 11 is detachably attached to the chamber body 12. The diameter (inside diameter) of the vacuum chamber 1 in plan view is, for example, but is not limited to, about 1100 mm.

A separation gas supply pipe 51 is connected to the center of the upper side of the vacuum chamber 1 (or the center of the top plate 11). The separation gas supply pipe 51 supplies a separation gas to a center area C in the vacuum chamber 1 to prevent different process gases from mixing with each other in the center area C.

A center part of the rotary table 2 is fixed to a substantially-cylindrical core 21. A rotational shaft 22 is connected to a lower surface of the core 21 and extends in the vertical direction. The rotary table 2 is rotated, clockwise in the example of FIG. 2, by a driving unit 23 about the vertical axis of the rotary shaft 22. The diameter of the rotary table 2 is, for example, but is not limited to, about 1000 mm.

The rotational shaft 22 and the driving unit 23 are housed in a case 20. An upper-side flange of the case 20 is hermetically attached to the lower surface of a bottom part 14 of the vacuum chamber 1. A purge gas supply pipe 72 is connected to the case 20. The purge gas supply pipe 72 supplies a purge gas (separation gas) such as a nitrogen gas to an area below the rotary table 2.

A part of the bottom part 14 of the vacuum chamber 1 surrounding the core 21 forms a ring-shaped protrusion 12a that protrudes upward toward the rotary table 2.

Circular recesses 24 (or substrate mounting areas), where the wafers W with a diameter of, for example, 300 mm are placed, are formed on the upper surface of the rotary table 2. Multiple (e.g., five) recesses 24 are arranged along the rotational direction of the rotary table 2. Each recess 24 has an inside diameter that is slightly (e.g., from 1 mm to 4 mm) greater than the diameter of the wafer W. The depth of the recess 24 is substantially the same as or greater than the thickness of the wafer W. Accordingly, when the wafer W is placed in the recess 24, the height of the upper surface of the wafer W becomes substantially the same as or lower than the height of the upper surface of the rotary table 2 (the surface where the recesses 24 are not formed). When the depth of the recess 24 is excessively greater than the thickness of the wafer W, it may adversely affect film deposition. Therefore, the depth of the recess 24 is preferably less than or equal to about three times the thickness of the wafer W. Through holes (not shown) are formed in the bottom of the recess 24 to allow multiple (e.g., three) elevating pins to pass through. The elevating pins raise and lower the wafer W.

As illustrated in FIG. 2, multiple (e.g., four) nozzles 31, 34, 41, and 42 made of, for example, quartz are arranged at intervals in a circumferential direction of the vacuum chamber 1. The nozzles 31, 34, 41, and 42 extend radially, and are disposed to face areas that the recesses 24 of the rotary table 2 pass through. The nozzles 31, 34, 41, and 42 are placed between the rotary table 2 and the top plate 11. In other words, the nozzles 31, 34, 41, and 42 extend horizontally from the outer wall of the vacuum chamber 1 toward the center area C so as to face the wafers W. In the example of FIG. 2, a plasma processing gas nozzle 34, a separation gas nozzle 41, a first process gas nozzle 31, and a separation gas nozzle 42 are arranged clockwise (the rotational direction of the rotary table 2) from a transfer port 15 in this order. Also in the example of FIG. 2, a second process gas nozzle 32 is provided. The second process gas nozzle 32 is used as necessary depending on, for example, the type of substrate processing.

In the present embodiment, one nozzle is provided for each process area. However, multiple nozzles may be provided for each process area. For example, plasma processing gas nozzles 34a and 34b may be provided in a plasma process area to supply an argon gas and an oxygen gas. Alternatively, only the plasma processing gas nozzle 34a may be provided, and a mixed gas of an argon gas and an oxygen gas may be supplied from the plasma processing gas nozzle 34a.

The first process gas nozzle 31 may also be referred to as a "first process gas supply part". The plasma processing gas nozzle 34 may also be referred to as a "plasma processing gas supply part". The separation gas nozzles 41 and 42 may also be referred to as "separation gas supply parts".

The nozzles 31, 32, 34, 41, and 42 are connected via flow control valves to gas supply sources (not shown), respectively.

Gas discharge holes 33 for discharging a gas are formed in the lower side (which faces the rotary table 2) of each of the nozzles 31, 32, 34, 41, and 42. The gas discharge holes 33 are formed, for example, at regular intervals along the radial direction of the rotary table 2. The distance between the lower end of each of the nozzles 31, 32, 34, 41, and 42 and the upper surface of the rotary table 2 is, for example, from about 1 mm to about 5 mm.

An area below the first process gas nozzle 31 is a first process area P1 where a first process gas is adsorbed onto the wafer W. An area below the plasma processing gas nozzle 34 is a second process area P2 where a slimming (etching) process or a modification process is performed on a film on the wafer W. The separation gas nozzles 41 and 42 are used to form separation areas D for separating the first process area P1 and the second process area P2 from each other.

Figure 3:
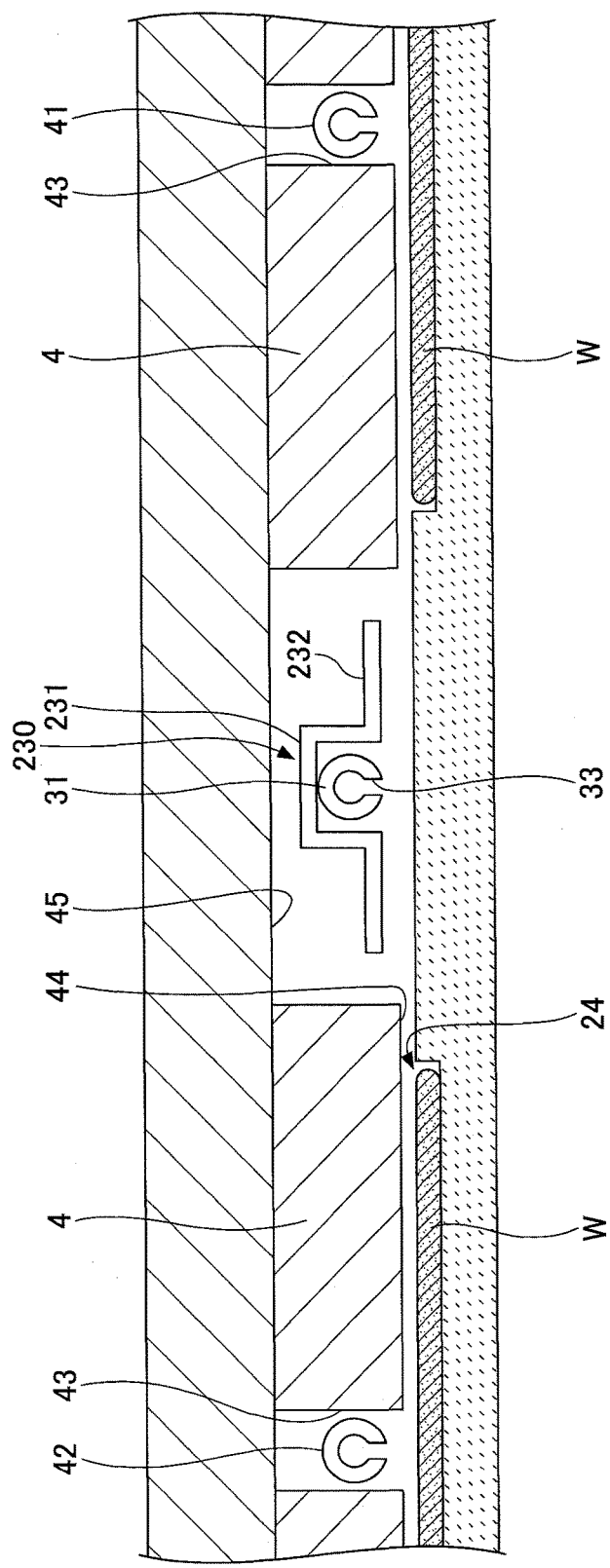
FIG. 3 is a cross-sectional view of a part of a substrate processing apparatus taken along a concentric circle of a rotary table.

FIG. 3 is a cross-sectional view of a part of the substrate processing apparatus taken along a concentric circle of the rotary table 2. FIG. 3 illustrates a cross section of a part of the substrate processing apparatus from one of the separation areas D through the first process area P1 to the other one of the separation areas D.

Substantially fan-shaped protrusions 4 are attached to the lower surface the top plate 11 of the vacuum chamber 1 at positions corresponding to the separation areas D. In the vacuum chamber 1, flat and low ceiling surfaces 44 (first ceiling surfaces) are formed by the lower surfaces of the protrusions 4, and ceiling surfaces 45 (second ceiling surfaces) are formed by the lower surface of the top plate 11. The ceiling surfaces 45 are located on the corresponding sides of the ceiling surfaces 44 in the circumferential direction, and are at higher positions than the ceiling surfaces 44.

As illustrated in FIG. 2, each of the protrusions 4 forming the ceiling surface 44 has a fan-like planar shape whose apex is cut off to form an arc-shaped side. Also, a groove 43 extending in the radial direction is formed in the protrusion 4 at the center in the circumferential direction. The corresponding one of the separation gas nozzles 41 and 42 is placed in the groove 43. A peripheral part of the protrusion 4 (a part along the outer edge of the vacuum chamber 1) is bent to form an L-shape to prevent the process gases from mixing with each other. The L-shaped part of the protrusion 4 faces the outer end face of the rotary table 2 and is slightly apart from the chamber body 12.

A nozzle cover 230 is provided above the first process gas nozzle 31. The nozzle cover 230 causes the first process gas to flow along the wafer W, and causes the separation gas to flow near the top plate 11 instead of near the wafer W. As illustrated in FIG. 3, the nozzle cover 230 includes a substantially-box-shaped cover 231 having an opening in the lower side to accommodate the first process gas nozzle 31, and flow regulating plates 232 connected to the upstream and downstream edges of the opening of the cover 231 in the rotational direction of the rotary table 2. A side wall of the cover 231 near the center of rotation of the rotary table 2 extends toward the rotary table 2 to face an end of the first process gas nozzle 3. Another side wall of the cover 231 near the outer edge of the rotary table 2 is partially cut off so as not to interfere with the first process gas nozzle 31.

A plasma generator 81 is provided above the plasma processing gas nozzle 34 to convert a plasma processing gas discharged into the vacuum chamber 1 into plasma.

Figure 4:
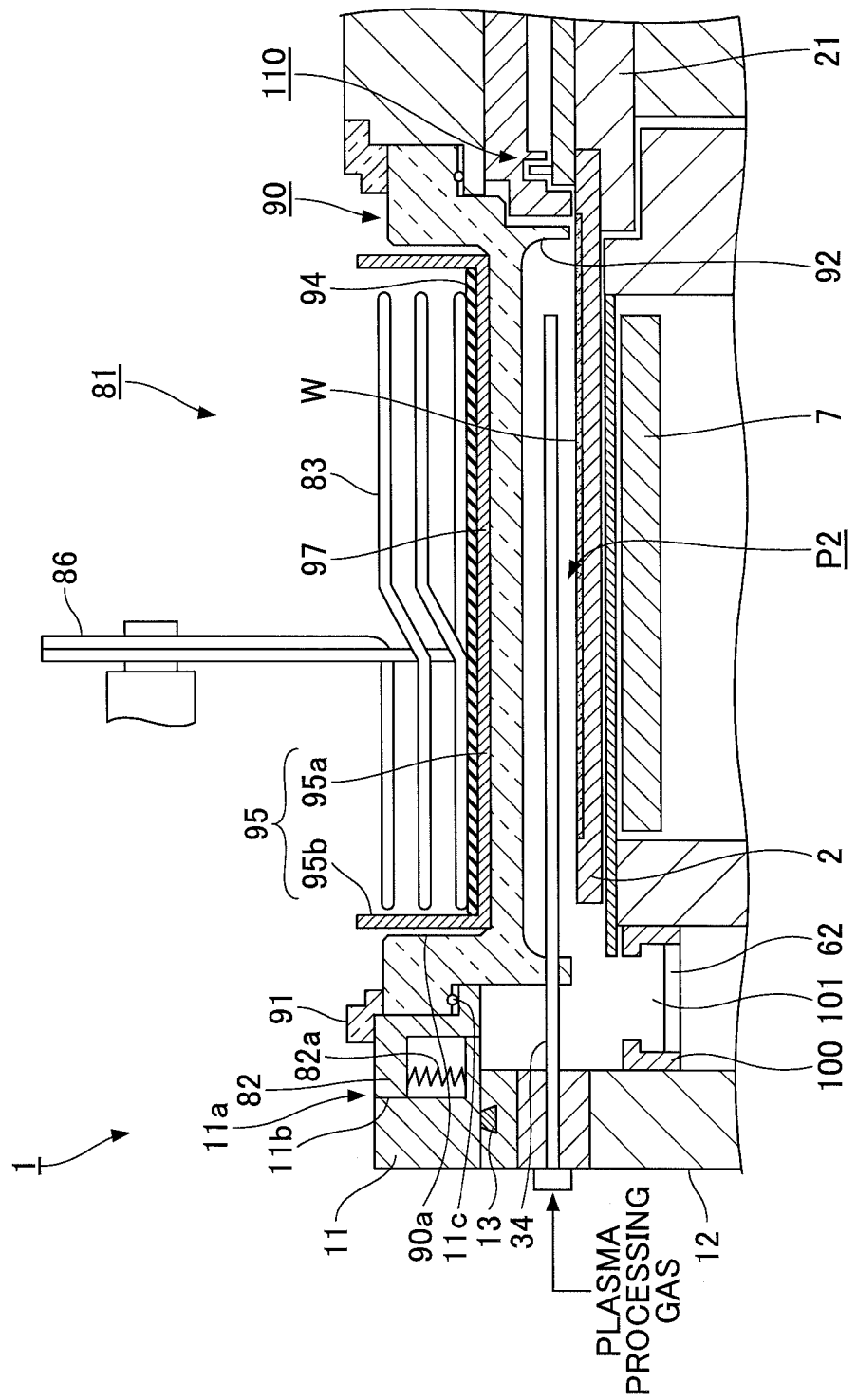
FIG. 4 is a cut-away side view of a plasma generator.
Figure 5:
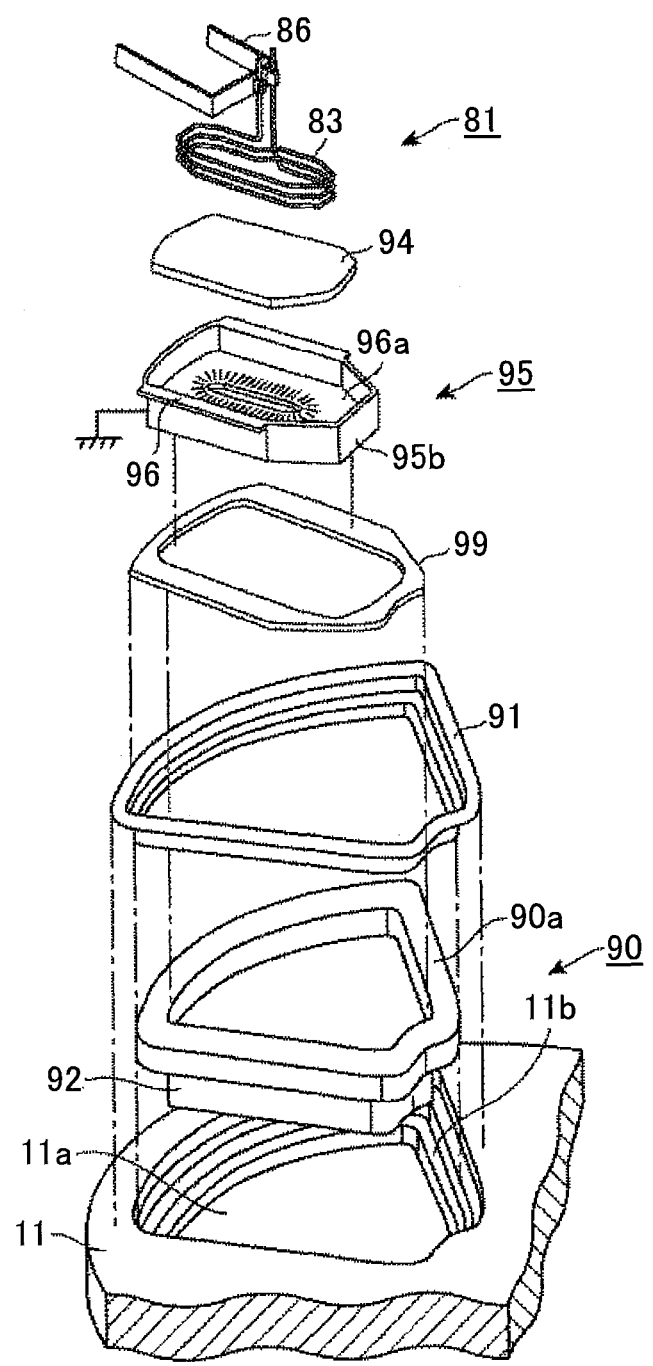
FIG. 5 is an exploded perspective view of a plasma generator.
Figure 6:
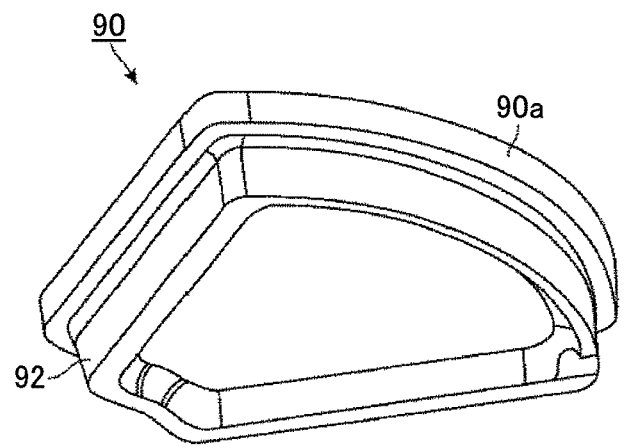
FIG. 6 is a perspective view of a housing of a plasma generator.

FIG. 4 is a cut-away side view of the plasma generator 81. FIG. 5 is an exploded perspective view of the plasma generator 81. FIG. 6 is a perspective view of a housing 90 of the plasma generator 81.

The plasma generator 81 includes an antenna 83 that is made of, for example, a metal wire and is wound, for example, three times around a vertical axis to form a coil. In plan view, the plasma generator 81 is disposed to surround a strip-shaped area extending in the radial direction of the rotary table 2 and to extend across the diameter of the wafer W on the rotary table 2.

The antenna 83 is connected via a matching box 84 to a high-frequency power source 85 that has, for example, a frequency of 13.56 MHz and output power of 5000 W. The antenna 83 converts a plasma processing gas into plasma by inductive coupling. The antenna 83 is hermetically separated from the inner area of the vacuum chamber 1. As illustrated in FIGS. 1, 2, and 4, a connection electrode 86 electrically connects the antenna 83, the matching box 84, and the high-frequency power source 85.

As illustrated in FIGS. 4 and 5, an opening 11a having a substantially fan shape in plan view is formed in the top plate 11 at a position above the plasma processing gas nozzle 34.

As illustrated in FIG. 4, a ring-shaped part 82 is hermetically attached to the periphery of the opening 11a. The ring-shaped part 82 extends along the periphery of the opening 11a. The housing 90 is hermetically attached to the inner circumferential surface of the ring-shaped part 82. That is, the outer circumferential surface of the ring-shaped part 82 faces an inner surface 11b of the opening 11a of the top plate 11, and the inner circumferential surface of the ring-shaped part 82 faces a flange 90a of the housing 90. The housing 90 is placed via the ring-shaped part 82 in the opening 11a to enable the antenna 83 to be placed at a position lower than the top plate 11. The housing 90 may be composed of a dielectric material such as quartz.

As illustrated in FIG. 4, the ring-shaped part 82 includes a bellows 82a that can expand and contract in the vertical direction. The plasma generator 81 is configured to be moved upward and downward by a driving mechanism (elevating mechanism) (not shown) such as an electric actuator. The bellows 82 expands and contracts as the plasma generator 81 moves upward and downward. This configuration makes it possible to change the distance between the plasma generator 81 and the wafer W (i.e., the rotary table 2) during plasma processing. The distance between the plasma generator 81 and the rotary table 2 may be referred to as a "distance of plasma generating space". The distance between the plasma generator 81 and the rotary table 2 is changeable between, for example, 20 mm and 120 mm by the electric actuator and the bellows 82a.

In the present embodiment, the distance between the plasma generator 81 and the wafer W is adjusted by moving the plasma generator 81 upward and downward via the bellows 82a. However, the present invention is not limited to the above embodiment. For example, a mount table (the rotary table 2) on which the wafer W is placed may be configured to move upward and downward to change the distance between the plasma generator 81 and the wafer W. In this case, a bellows that can expand and contract in the vertical direction may be provided as a component of a rotational shaft of the rotary table 2 so that a surface on which the wafer W is placed (i.e., a surface of the rotary table 2 on which the wafer W is placed) can be moved upward and downward. For example, as illustrated in FIG. 1, a bellows 16 that can expand and contract in the vertical direction may be provided between the bottom part 14 of the vacuum chamber 1 and the case 20, and the rotary table 2 on which the wafer W is placed may be moved upward and downward by an elevating mechanism (not shown). The bellows 16 expands and contracts as the rotary table 2 is moved upward and downward to change the distance between the plasma generator 81 and the wafer W. With a bellows provided as a component of a rotational shaft of the rotary table 2, it is possible to change the distance between the plasma generator 81 and the wafer W while keeping a process surface of the wafer W horizontal.

As illustrated by FIG. 6, an upper peripheral part surrounding the entire circumference of the housing 90 extends horizontally to form the flange 90a. Also, a central part of the housing 90 in plan view is recessed toward the inner area of the vacuum chamber 1.

The housing 90 is disposed such that the housing 90 extends across the diameter of the wafer W in the radial direction of the rotary table 2 when the wafer W is located below the housing 90. A sealing part 11c such as an O-ring is provided between the ring-shaped part 82 and the housing 90.

The internal atmosphere of the vacuum chamber 1 is hermetically sealed by the ring-shaped part 82 and the housing 90. The ring-shaped part 82 and the housing 90 are placed in the opening 11a, and the entire circumference of the housing 90 is pressed downward via a frame-shaped pressing part 91 that is placed on the upper surfaces of the ring-shaped part 82 and the housing 90 and extends along a contact between the ring-shaped part 82 and the housing 90. The pressing part 91 is fixed to the top plate 11 with, for example, bolts. As a result, the internal atmosphere of the vacuum chamber 1 is sealed hermetically. In FIG. 5, the ring-shaped part 82 is omitted for brevity.

As illustrated by FIG. 6, the housing 90 also includes a protrusion 92 that extends along the circumference of the housing 90 and protrudes vertically from the lower surface of the housing 90 toward the rotary table 2. The protrusion 92 surrounds the second process area P2 below the housing 90. The plasma processing gas nozzle 34 is placed in an area surrounded by the inner circumferential surface of the protrusion 92, the lower surface of the housing 90, and the upper surface of the rotary table 2. A part of the protrusion 92 near a base end (at the inner wall of the vacuum chamber 1) of the plasma processing gas nozzle 34 is cut off to form an arc-shaped cut-out that conforms to the outer shape of the plasma processing gas nozzle 34.

As illustrated in FIG. 4, on the lower side (i.e., the second process area P2) of the housing 90, the protrusion 92 is formed along the circumference of the housing 90. The protrusion 92 prevents the sealing part 11c from being directly exposed to plasma, i.e., isolates the sealing part 11c from the second process area P2. With this configuration, even when plasma spreads from the second process area P2 toward the sealing part 11c, the plasma needs to pass through an area below the protrusion 92 and is therefore deactivated before reaching the sealing part 11c.

A Faraday shield 95 is provided above the housing 90. The Faraday shield 95 is grounded, and is composed of a conductive plate-like part such as a metal plate (e.g., copper plate) that is shaped to roughly conform to the internal shape of the housing 90. The Faraday shield 95 includes a horizontal surface 95a that extends horizontally along the bottom surface of the housing 90, and a vertical surface 95b that extends upward from the outer edge of the horizontal surface 95a and surrounds the horizontal surface 95a.

Figure 7:
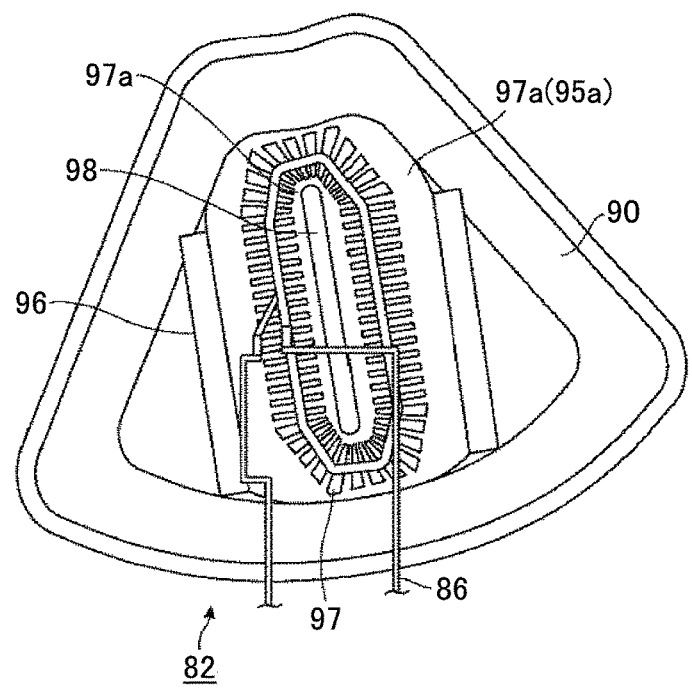
FIG. 7 is a plan view of a plasma generator.
Figure 8:
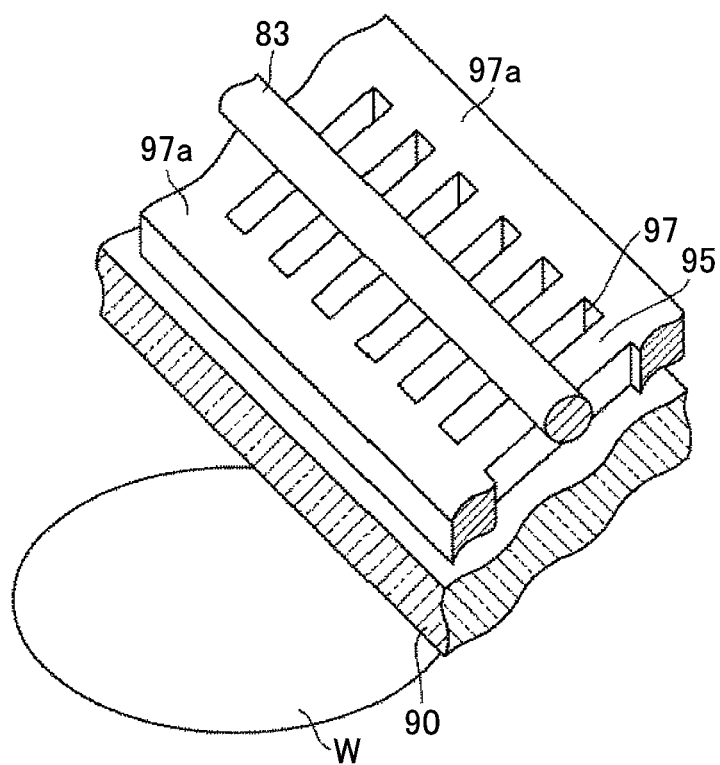
FIG. 8 is a perspective view of a part of a Faraday shield of a plasma generator.

FIG. 7 is a plan view of the plasma generator 81. FIG. 8 is a perspective view of a part of the Faraday shield 95 of the plasma generator 81.

When seen from the center of rotation of the rotary table 2, the right and left upper ends of the Faraday shield 95 extend horizontally rightward and leftward, respectively, to form supports 96. A frame 99 is provided between the Faraday shield 95 and the housing 90 to support the supports 96 from below. The frame 99 is supported by a part of the housing 90 near the center area C and a part of the flange 90a near the outer edge of the rotary table 2.

When an electric field reaches the wafer W, for example, electric wiring formed inside of the wafer W may be electrically damaged. To prevent this problem, as illustrated by FIG. 8, multiple slits 97 are formed in the horizontal surface 95a. The slits 97 prevent an electric-field component of an electric field and a magnetic field (electromagnetic field) generated by the antenna 83 from reaching the wafer W below the Faraday shield 95, and allow a magnetic field component of the electromagnetic field to reach the wafer W.

As illustrated in FIGS. 7 and 8, the slits 97 extend in directions that are orthogonal to the direction in which the antenna 83 is wound, and are arranged to form a circle below the antenna 83. The width of each slit 97 is set at a value that is about 1/10000 or less of the wavelength of a high frequency supplied to the antenna 83. Circular electrically-conducting paths 97a made of, for example, a grounded conductor are provided at the ends in the length direction of the slits 97 to close the open ends of the slits 97. An opening 98 is formed in an area of the Faraday shield 95 where the slits 97 are not formed, i.e., an area surrounded by the antenna 83. The opening 98 is used to check whether plasma is emitting light. In FIG. 2, the slits 97 are omitted for brevity, but an area where the slits 97 are formed is indicated by a dashed-dotted line.

As illustrated in FIG. 5, an insulating plate 94 is stacked on the horizontal surface 95a of the Faraday shield 95. The insulating plate 94 is made of, for example, quartz with a thickness of about 2 mm, and is used for insulation between the Faraday shield 95 and the plasma generator 81 disposed above the Faraday shield 95. Thus, the plasma generator 81 is disposed to face the inside of the vacuum chamber 1 (i.e., the wafer W on the rotary table 2) via the housing 90, the Faraday shield 95, and the insulating plate 94.

Next, other components of the substrate processing apparatus of the present embodiment are described.

As illustrated in FIG. 2, a side ring 100, which is a cover, is provided along the outer circumference of the rotary table 2 and slightly below the rotary table 2. First and second evacuation ports 61 and 62, which are apart from each other in the circumferential direction, are formed in the upper surface of the side ring 100. More specifically, the first and second evacuation ports 61 and 62 are formed in the side ring 100 at positions that correspond to evacuation ports formed in the bottom surface of the vacuum chamber 1.

The first evacuation port 61 is formed at a position that is between the first process gas nozzle 31 and the separation area D located downstream of the first process gas nozzle 31 in the rotational direction of the rotary table 2, and is closer to the separation area D than to the first process gas nozzle 31. The second evacuation port 62 is formed at a position that is between the plasma generator 81 and the separation area D located downstream of the plasma generator 81 in the rotational direction of the rotary table 2, and is closer to the separation area D than to the plasma generator 81.

The first evacuation port 61 is configured to exhaust the first process gas and the separation gas, and the second evacuation port 62 is configured to exhaust the plasma processing gas and the separation gas. Each of the first evacuation port 61 and the second evacuation port 62 is connected via an evacuation pipe 63 with a pressure controller 65 such as a butterfly valve to a vacuum pump 64 that is an example of an evacuation mechanism.

Here, gases that flow from the upstream in the rotational direction of the rotary table 2 to the process area P2 and then flow toward the second evacuation port 62 may be blocked by the housing 90 that extends from the center area C toward the outer wall of the vacuum chamber 1. For this reason, a groove-like gas flow path 101 for allowing the gases to flow is formed in the upper surface of the side ring 100 at a position closer to the outer wall of the vacuum chamber 1 than the outer end of the housing 90.

As illustrated by FIG. 1, a protrusion 5 with a substantially ring shape is formed on a center part of the lower surface of the top plate 11. The protrusion 5 is connected with the inner ends (that face the center area C) of the protrusions 4. The height of the lower surface of the protrusion 5 is substantially the same as the height of the lower surfaces (the ceiling surfaces 44) of the protrusions 4. A labyrinth structure 110 is formed above the core 21 at a position closer to the center of rotation of the rotary table 2 than the protrusion 5. The labyrinth structure 110 prevents gases from mixing with each other in the center area C.

As described above, the housing 90 extends up to a position near the center area C. Therefore, the core 21 for supporting the center part of the rotary table 2 is formed near the center of rotation so that a part of the core 21 above the rotary table 2 does not contact the housing 90. For this reason, compared with outer peripheral areas, gases tend to easily mix with each other in the center area C. The labyrinth structure 110 above the core 21 extends gas flow paths and thereby prevents gases from mixing with each other.

More specifically, the labyrinth structure 110 is formed by arranging a ring-shaped first wall and a ring-shaped second wall in the radial direction of the rotary table 2. The first wall extends vertically from the rotary table 2 toward the top plate 11, and the second wall extends vertically from the top plate 11 toward the rotary table 2. For example, the first process gas discharged from the first process gas nozzle 31 needs to go over the labyrinth structure 110 to flow into the center area C. For this reason, the flow speed of the first process gas decreases and the first process gas becomes less diffusible as it comes closer to the center area C. As a result, before reaching the center area C, the first process gas is pushed back toward the first process area P1 by the separation gas supplied into the center area C. Similarly, other gases flowing toward the center area C are also prevented by the labyrinth structure 110 from reaching the center area C. Thus, the labyrinth structure 110 prevents process gases from mixing with each other in the center area C.

On the other hand, a nitrogen gas supplied from the separation gas supply pipe 51 into the center area C tries to diffuse rapidly in the radial direction, but the flow speed of the nitrogen gas decreases as it goes over the labyrinth structure 110. In this case, although the nitrogen gas also tries to enter, for example, a very narrow area between the rotary table 2 and the protrusion 92, the nitrogen gas whose flow speed has been decreased by the labyrinth structure 110 tends to flow into a relatively wide area such as an area where a conveying arm 10 moves forward and backward. Thus, the labyrinth structure 110 also prevents the nitrogen gas from flowing into an area below the housing 90.

As illustrated in FIG. 1, a heater unit 7 is provided in a space between the rotary table 2 and the bottom part 14 of the vacuum chamber 1. The heater unit 7 can heat, via the rotary table 2, the wafer W on the rotary table 2 to a temperature between the ambient temperature and about 300° C. In FIG. 1, reference number 71a indicates a cover part disposed laterally to the heater unit 7, and reference number 7a indicates a cover part disposed above the heater unit 7. Purge gas supply pipes 73 are provided in the bottom part 14 of the vacuum chamber 1 below the heater unit 7. The purge gas supply pipes 73 are arranged in the circumferential direction and used to purge the space where the heater unit 7 is placed.

As illustrated by FIG. 2, the transfer port 15 is formed in the side wall of the vacuum chamber 1. The transfer port 15 is used to transfer the wafer W between the conveying arm 10 and the rotary table 2. A gate valve G is provided to hermetically open and close the transfer port 15. A camera unit 10a is provided above the top plate 11 in an area where the conveying arm 10 is moved into and out of the vacuum chamber 1. The camera unit 10a is used to detect the outer edge (or rim) of the wafer W. The camera unit 10a captures an image of the outer edge of the wafer W and thereby detects, for example, whether the wafer W is on the conveying arm 10, misalignment of the wafer W on the rotary table 2, and misalignment of the wafer W on the conveying arm 10. The camera unit 10a has a wide field of view that covers the diameter of the wafer W. The wafer W is transferred between the recess 24 of the rotary table 2 and the conveying arm 10 when the recess 24 is at a position (transfer position) facing the transfer port 15. For this reason, elevating pins and an elevating mechanism (not shown) for lifting the wafer W are provided at the transfer position below the rotary table 2. The elevating pins pass through the recess 24 and push the lower surface of the wafer W upward.

The substrate processing apparatus of the present embodiment also includes a controller 120 implemented by a computer for controlling the operations of the entire substrate processing apparatus. The controller 120 includes a memory that stores a program for causing the substrate processing apparatus to perform substrate processing described later. The program may include steps for causing the substrate process apparatus to perform various operations. The program may be stored in a storage 121 that is a storage medium such as a hard disk, a compact disk, a magneto-optical disk, a memory card, or a flexible disk, and installed from the storage 121 into the control unit 120.

<Substrate Processing Method>

Next, an exemplary substrate processing method performed by the substrate processing apparatus of the present embodiment is described. The substrate processing apparatus of the present embodiment may be applied to, for example, 1) a first process of slimming a film that includes carbon and formed on the wafer W (slimming step); and 2) a second process of forming a film by ALD on the wafer W and modifying the formed film (film deposition step and modification step). However, the substrate processing apparatus of the present embodiment may also be applied to other types of substrate processing by changing process conditions (e.g., types of gases, gas flow rates, the rotational speed of the rotary table 2, the distance between the plasma generator 81 and the rotary table 2, pressure, high-frequency output, and temperature).

In the exemplary substrate processing method described below, the slimming step, the film deposition step, and the modification step are performed consecutively on a wafer W on which a film (e.g., a resist pattern) including a carbon pattern has been formed in advance. Any other type of film such as an electric wiring structure may have been formed on the wafer W through a film deposition process and a slimming process.

As the integration degree of semiconductor devices increases, the wiring and the separation width required for a production process become smaller. Generally, a fine pattern is formed by forming a resist pattern including carbon by photolithography, and by etching underlying thin films using the resist pattern as an etching mask. Therefore, to form a fine pattern, photolithography techniques are important. However, recent miniaturization of semiconductor devices requires resolution higher than the resolution limit of photolithography. For this reason, in the first process, slimming of a resist pattern is performed to correct dimensions after lithography.

Also, a fine pattern forming method, which combines a process of forming, for example, a silicon oxide film on a resist pattern with a process such as a side-wall transfer (SWT) process or a lithography-lithography etching (LLE) process, is getting attention as a technology to form a fine pattern finer than the resolution limit of photolithography. In the second process of the present embodiment, for example, a silicon oxide film is formed on the "slimmed" resist pattern (on which slimming has been performed in the first process) through consecutive processes in the same chamber (in situ process).

In the exemplary substrate processing method described below, the substrate processing apparatus is applied to a slimming process and a film deposition process (and a modification process). However, the substrate processing apparatus of the present embodiment may also be applied to other substrate processing methods.

Next, details of a substrate carrying process, the first process, and the second process are described.

To carry substrates such as the wafers W into the vacuum chamber 1, the gate valve G is first opened. Next, while the rotary table 2 is being rotated intermittently, the wafers W are carried into the vacuum chamber 1 via the transfer port 15 and placed on the rotary table 2 by the conveying arm 10.

<First Process: Slimming (Etching) Step>

Next, the gate valve G is closed, the pressure in the vacuum chamber 1 is adjusted to a predetermined value by the vacuum pump 64 and the pressure controller 65, and the wafers W are heated to a predetermined temperature by the heater unit 7 while rotating the rotary table 2.

Next, the distance between the plasma generator 81 and the rotary table 2 is set at a predetermined value. Then, while the supply of a process gas from the first process gas nozzle 31 is cut off, plasma processing gases (e.g., an argon gas and an oxygen gas) are supplied at predetermined flow rates from the plasma processing gas nozzles 34a and 34b.

The pressure controller 65 adjusts the pressure in the vacuum chamber 1 to a predetermined value. The plasma generator 81 applies high-frequency power of a predetermined level to the antenna 83. Also, the antenna 83 generates an electric field and a magnetic field (electromagnetic field).

In the housing 90, the electric field of the electromagnetic field generated by the antenna 83 is reflected, absorbed, or attenuated by the Faraday shield 95 and is thereby prevented from entering the vacuum chamber 1.

The Faraday shield 95 includes the electrically-conducting paths 97a at the ends in the length direction of the slits 97, and the vertical surface 95b disposed lateral to the antenna 83. This configuration also blocks the electric field that tries to go around the slits 97 and move toward the wafer W via areas at the ends in the length direction of the slits 97.

On the other hand, the magnetic field passes through the slits 97 of the Faraday shield 95, and enters the vacuum chamber 1 via the bottom surface of the housing 90. As a result, the plasma processing gases are converted into plasma by the magnetic field at a position below the housing 90. This configuration makes it possible to generate plasma including many active species that are less likely to electrically damage the wafer W.

Here, a base film including carbon is formed beforehand on the surface of the wafer W. Accordingly, a certain amount of this base film including carbon is plasma-etched by the active species (ions and radicals) in the plasma.

Slimming characteristics of the slimming process of the present embodiment are determined by the distance between the plasma generator 81 and the rotary table 2, the types of plasma processing gases, the flow rates of plasma processing gases, the pressure in the vacuum chamber, the output level of the high-frequency power source 85, the temperature of the wafer W, and the rotational speed of the rotary table 2.

As described above, the substrate processing apparatus of the present embodiment includes the ring-shaped part 82 between the opening 11a of the top plate 11 and the flange 90a of the housing 90, and the ring-shaped part 82 includes the bellows 82a that can expand and contract in the vertical direction. This configuration makes it possible to adjust the distance between the plasma generator 81 and the rotary table 2 to a desired value while hermetically sealing the second process area P2. In other words, the ring-shaped part 82 and the housing 90 prevents surrounding gases from entering the second process area P2 when the distance between the plasma generator 81 and the rotary table 2 is changed.

The distance between the plasma generator 81 and the rotary table 2 is, for example, but is not limited to, about 20 mm to about 120 mm. In the slimming step, the distance between the plasma generator 81 and the rotary table 2 is preferably set at a large value. When the distance between the plasma generator 81 and the rotary table 2 is long, most of ion components of the active species supplied to the wafer W disappear before reaching the wafer W and as a result, the wafer W is processed mostly by radical components. Because a film including carbon can be easily etched by radical components, a sufficient etching rate can be achieved even when the output of the high-frequency power source 85 is set at a low level that is easily controllable. That is, by making the distance between the plasma generator 81 and the rotary table 2 long, it is possible to improve the uniformity of etching, achieve isotropic etching, and control the amount of etching, i.e., to improve the controllability of plasma etching.

The distance between the plasma generator 81 and the rotary table 2 may be changed in a recipe.

As the plasma processing gas, for example, a mixed gas of a noble gas such as an Ar gas, and an oxygen- or hydrogen-containing gas such as an $O_2$ gas, $O_3$ gas, an $H_2O$ gas, an $H_2$ gas, or an $NH_3$ gas may be used. For example, the flow rate of the noble gas may be between about 1000 sccm and about 20000 sccm (e.g., 15000 sccm), and the flow rate of the oxygen-containing gas may be between about 100 sccm and about 2000 sccm (e.g., 500 sccm). The pressure in the vacuum chamber 1 may be, for example, between about 0.5 Torr and about 4 Torr (e.g., 1.8 Torr). The output level of the high-frequency power source 85 may be, for example, between about 500 W and about 5000 W (e.g., between 1000 W and 1600 W). The temperature of the wafer W may be, for example, between about 40° C. and about 120° C. (e.g., 85° C.). The rotational speed of the rotary table 2 may be, for example, between about 10 rpm and about 300 rpm (e.g., 180 rpm).

<Second Process: Film Deposition Step and Modification Step>

The substrate processing apparatus of the present embodiment can perform a film deposition process according to ALD on the wafer W including a carbon pattern that has been etched by a predetermined amount.

In the film deposition process according to ALD, desired film deposition characteristics can be obtained by adjusting the distance between the plasma generator 81 and the rotary table 2, the types of plasma processing gases, the flow rates of plasma processing gases, the pressure in the vacuum chamber, the output level of the high-frequency power source 85, the temperature of the wafer W, and the rotational speed of the rotary table 2. An exemplary film deposition method performed by the substrate processing apparatus according to ALD is described below.

First, the wafer W is heated to a predetermined temperature by the heater unit 7.

Next, a first process gas such as an Si-containing gas or a metal-containing gas is discharged at a predetermined flow rate from the first process gas nozzle 31, and a plasma processing gas including an oxygen gas or a nitrogen gas is discharged at a predetermined flow rate from the plasma processing gas nozzle 34.

Then, the pressure controller 65 adjusts the pressure in the vacuum chamber 1 to a predetermined value. Also, the plasma generator 81 applies high-frequency power of a predetermined level to the antenna 83.

As the rotary table 2 is rotated, the Si-containing gas or the metal-containing gas is adsorbed onto the surface of the wafer W in the first process area P1, and the Si-containing gas or the metal-containing gas adsorbed onto the wafer W is oxidized or nitrided by plasma of the plasma processing gas in the second process area P2. As a result, one or more molecular layers of an oxide film or a nitride film, which is a thin-film component, are formed as a reaction product.

The distance between the plasma generator 81 and the rotary table 2 is, for example, but is not limited to, about 20 mm to about 120 mm. In the beginning of the film deposition step, the distance between the plasma generator 81 and the rotary table 2 is preferably set at a large value, for example, at 120 mm. Also, the output of the high-frequency power source 85 is preferably set at a comparatively low level, for example, at 1000 W. Because active species have a significant influence on the wafer W in the beginning of the film deposition step, the distance between the plasma generator 81 and the rotary table 2 is preferably set at a large value. Here, although it depends on the electric wiring structure formed in the wafer W to be processed and the types of film deposition gases, the "beginning of the film deposition step" may be defined as a period of time before the thickness of a deposited film reaches about 2 mm.

On the other hand, after a certain amount, e.g., 2 mm, of film is formed on the wafer W, the distance between the plasma generator 81 and the rotary table 2 is preferably set at a small value, for example, at about 30 mm. Also, the output of the high-frequency power source 85 is preferably set at a comparatively high level, for example, at 3000 W.

Reasons why the distance between the plasma generator 81 and the rotary table 2 is preferably set at a small value after a deposited film reaches a certain thickness are described below. Generally, because of, for example, a residual radical in the first process gas, a thin film formed by ALD includes impurities such as chlorine and organic matter. In the film deposition method of the present embodiment, the distance between the plasma generator 81 and the rotary table 2 is set at a small value after a film with a certain thickness is formed. This makes it possible to modify the formed film by ions in plasma. For example, when ions in the plasma hit the surface of the wafer W, the impurities are released from the film as HCl or an organic gas. Also, elements in the film are rearranged and the density of the film increases.

In the present embodiment, the rotary table 2 is rotated repeatedly, and steps including absorption of a process gas onto the surface of the wafer W, oxidation or nitriding of components of the process gas adsorbed onto the surface of the wafer W, and plasma modification of a reaction product are performed multiple times in this order. In other words, a film deposition process according to ALD and a modification process of a formed film are performed multiple times by rotating the rotary table 2.

In the substrate processing apparatus of the present embodiment, the separation areas D are provided between the first and second process areas P1 and P2. In other words, the separation areas D and the first and second process areas P1 and P2 are arranged alternately along the circumference direction of the rotary table 2. With this configuration, the process gas and the plasma processing gas are prevented from mixing with each other by the separation areas D, and are exhausted from the first and second evacuation ports 61 and 62.

Examples of the first process gas of the present embodiment include a silicon-containing gas such as DIPAS [diisopropylaminosilane], 3DMAS [trisdimethylaminosilane] gas, BTBAS [bistertialbutylaminosilane], DCS [dichlorosilane], and HCD [hexachlorodisilane]; and a metal-containing gas such as TiCl4 [titanium tetrachloride], Ti(MPD) (THD) [titanium methylpentanedionatobistetramethylheptanedionato], TMA [trimethylaluminum], TEMAZ [tetrakisethylmethylaminozirconium], TEMHF [tetrakisethylmethylaminohafnium], and Sr(THD)2 [strontium bistetramethylheptanedionato].

Various gases may be selected as the plasma processing gas depending on the usage of plasma. For example, a mixed gas of an Ar gas mainly used for generating plasma, and one or both of an oxygen-containing gas (e.g., $O_2$ gas, $O_3$ gas, or $H_2$ gas) and a hydrogen-containing gas (e.g., $H_2$ gas or $NH_3$ gas) suitable for a process to be performed on a formed film (e.g., plasma etching (slimming) or film modification by plasma) may be used as the plasma processing gas.

As the separation gas, for example, an $N_2$ gas may be used.

The flow rate of the first process gas during the film deposition step may be, for example, between 50 sccm and 1000 sccm.

The flow rate of the oxygen-containing gas included in the plasma processing gas may be, for example, between about 500 sccm and 5000 sccm (e.g., 500 sccm).

The pressure in the vacuum chamber 1 may be, for example, between about 0.5 Torr and about 4 Torr (e.g., 1.8 Torr).

The temperature of the wafer W may be, for example, between about 40° C. and about 200° C.

The rotational speed of the rotary table 2 may be, for example, between about 60 rpm and about 300 rpm.

Next, experiments performed according to the embodiment of the present invention are described below.

EXAMPLE 1

An experiment was performed to confirm that etching of a base film during a film deposition process can be suppressed by setting the distance between the plasma generator 81 and the rotary table 2 (which may be referred to as a "distance of plasma generating space") at a relatively large value in the beginning of the film deposition process.

A trench pattern (resist pattern) of a photoresist film (a film including carbon) was formed beforehand on a silicon wafer W, and a film deposition process was performed on the wafer W under the following deposition conditions to form an $SiO_2$ film on the resist pattern.

Deposition Conditions
  First process gas: DIPAS (LTO520)
  Plasma processing gas: Ar gas and $O_2$ gas
  Distance of plasma generating space: 30 mm (case 1-1) and 90 mm (case 1-2)
  *Other conditions were the same for cases 1-1 and 1-2.

The formed $SiO_2$ film was removed by wet etching using dihydrofuran (DHF) to expose the resist pattern.

For each of cases 1-1 and 1-2, the height from the substrate (wafer W) to the top of the resist pattern, the height from the substrate to the bottom of the resist pattern, and the width of the resist pattern were measured to analyze the influence of plasma on the base film during the film deposition process.

Table 1 illustrates the measurement results. Table 1 also includes initial measurement values of the resist pattern before the film deposition process.

TABLE 1

|  | Initial Measurement Values | Case 1-1 | Case 1-2 |
| --- | --- | --- | --- |
| Distance of plasma generating space (mm) |  | 90 | 30 |
| Height from substrate to top of resist pattern (nm) | 68-71 | 64-69 | 53-55 |
| Width of resist pattern (nm) | 33-35 | 33-36 | 32-35 |

TABLE 1-continued

| | Initial Measurement Values | Case 1-1 | Case 1-2 |
|---|---|---|---|
| Height from substrate to bottom of resist pattern (nm) | 14-16 | 16-17 | 14-16 |

As is apparent from table 1, in case 1-2 where the distance of plasma generating space was 30 mm, etching of the base film (resist pattern) proceeded during the film deposition process compared with case 1-1 where the distance of plasma generating space was 90 mm. This indicates that in case 1-2 where the distance of plasma generating space was 30 mm, ion components of active species reached the wafer W without being deactivated and etched the resist pattern because the distance between the plasma generator 81 and the rotary table 2 was relatively short. On the other hand, in case 1-1 where the distance of plasma generating space was 90 mm, the measured values are not greatly different from the initial measurement values (before the film deposition process). This indicates that etching of the base film during the film deposition process was suppressed. In other words, this indicates that the wafer W was processed mostly by radical components that are less damaging to the wafer W (i.e., have a low etching rate on the base film) because the distance between the plasma generator 81 and the rotary table 2 was relatively long.

The above results indicate that the distance between the plasma generator 81 and the rotary table 2 is preferably set at a relatively large value in the beginning of the film deposition process to suppress etching of the base film. On the other hand, after a certain amount, e.g., about 2 mm, of film is formed on the wafer W, the distance between the plasma generator 81 and the rotary table 2 is preferably set at a small value, e.g., about 30 mm, and the output of the high-frequency power source 85 is preferably set at a relatively high level, e.g., 3000 W, to efficiently modify the formed film.

EXAMPLE 2

An experiment was performed to confirm that the amount of etching and the uniformity of etching can be adjusted by changing the distance of plasma generating space.

A trench pattern (resist pattern) of a photoresist film (a film including carbon) was formed beforehand on a silicon wafer W with a diameter (p) of 300 mm, and a slimming (etching) process was performed on the wafer W under the following slimming conditions.

Slimming Conditions

Plasma processing gas: Ar gas, $O_2$ gas, and $NH_3$ gas

Distance of plasma generating space: 30 mm (case 2-1) and 90 mm (case 2-2)

*Other conditions were the same for cases 2-1 and 2-2.

Figure 9:
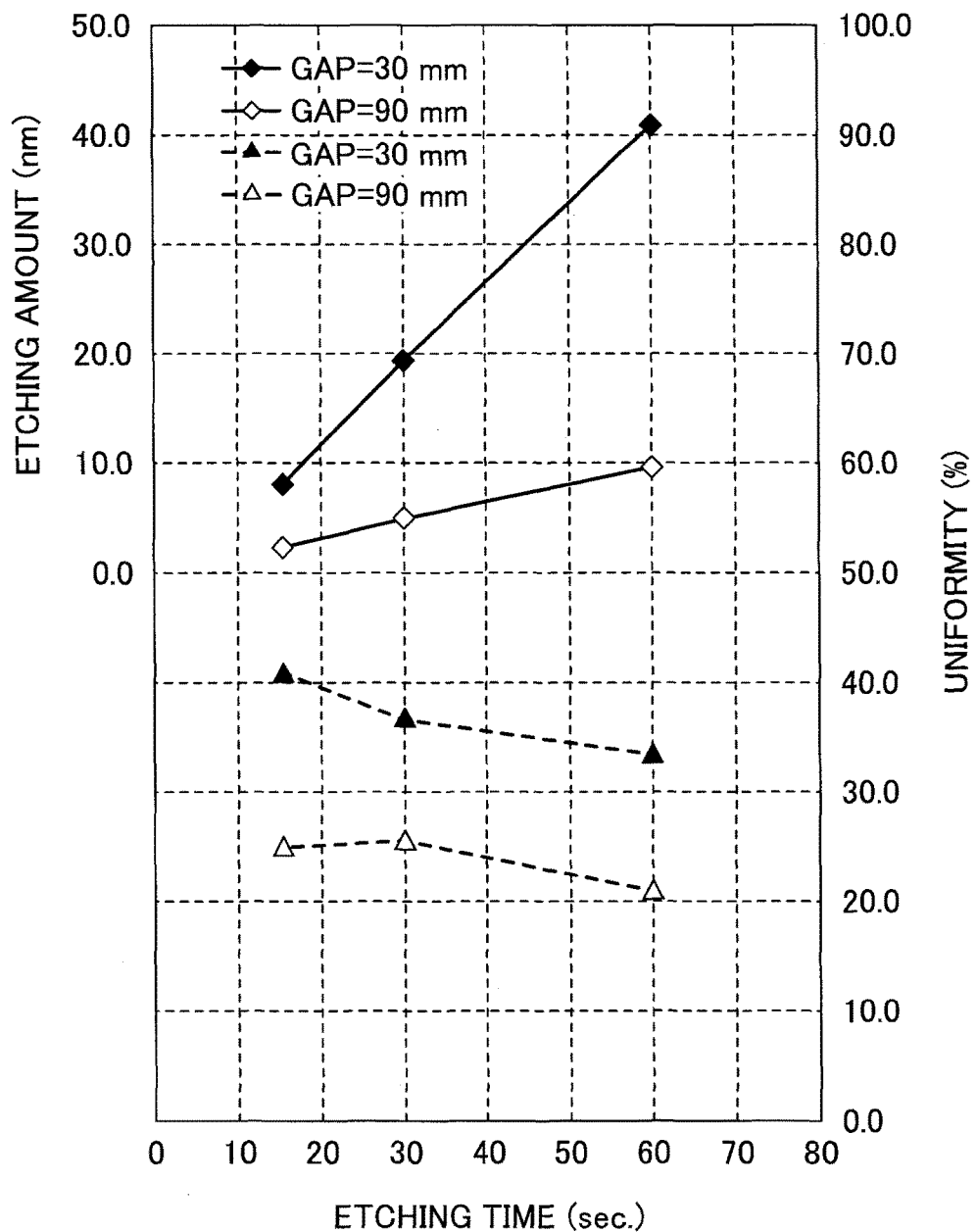
FIG. 9 is a graph illustrating an exemplary relationship between a distance of plasma generating space and etching characteristics.

FIG. 9 is a graph illustrating an exemplary relationship between the distance of plasma generating space and etching characteristics. In FIG. 9, the horizontal axis indicates etching time, the left vertical axis indicates the amount of etching, and the right vertical axis indicates "WIW uniformity". Also in FIG. 9, rhomboidal marks represent data points indicating the amount of etching, and triangular marks represent data points indicating uniformity. Here, WIW uniformity indicates the uniformity of the amount of etching at multiple points on the surface of the wafer W.

Further, in FIG. 9 and subsequent drawings, "GAP" indicates the distance between the plasma generator 81 and the rotary table 2 (i.e., the distance of plasma generating space).

As illustrated by FIG. 9, in both of case 2-1 (the distance of plasma generating space is 30 mm) and case 2-2 (the distance of plasma generating space is 90 mm), the amount of etching increases as the etching time increases. The etching rate in case 2-1 (30 mm) is higher than the etching rate in case 2-2 (90 mm). However, the etching rate in case 2-2 is still sufficiently high.

On the other hand, the uniformity in case 2-2 (90 mm) is better than the uniformity in case 2-1 (30 mm).

Figure 10A:
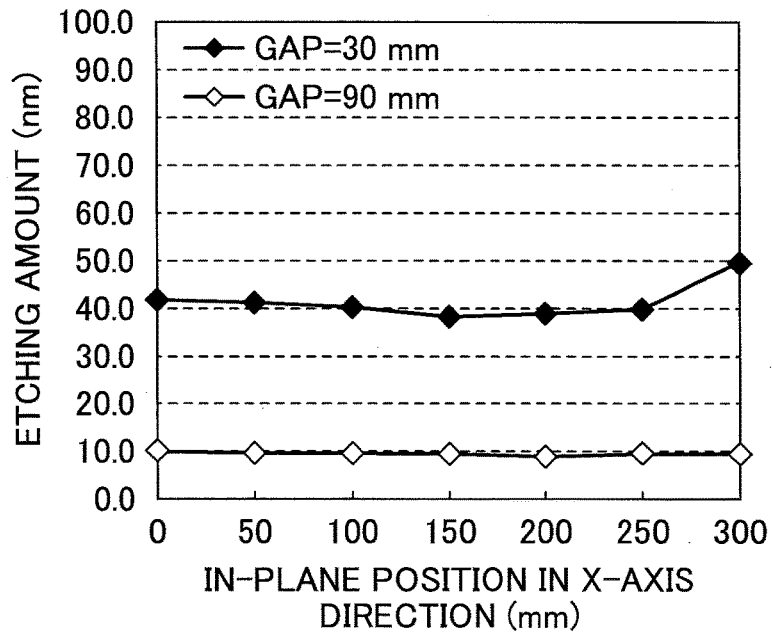
FIG. 10A is a graph illustrating another exemplary relationship between a distance of plasma generating space and etching characteristics.
Figure 10B:
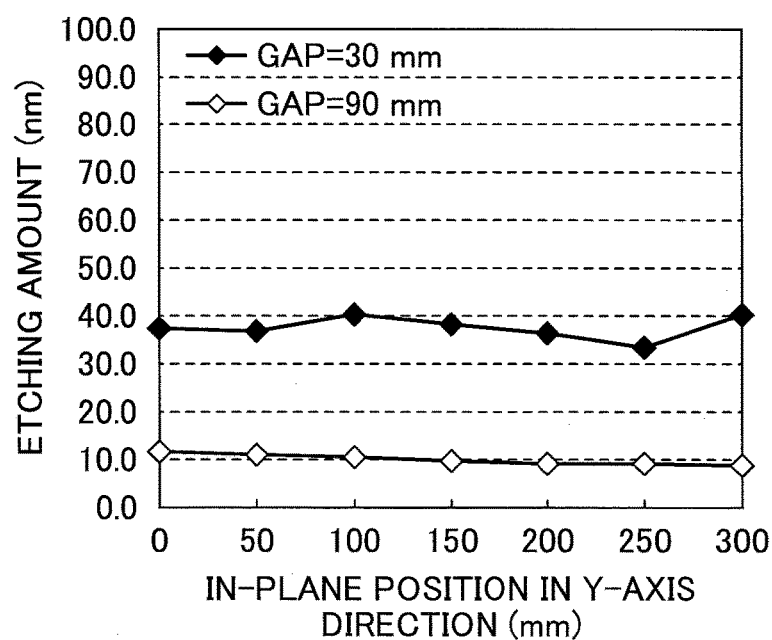
FIG. 10B is a graph illustrating another exemplary relationship between a distance of plasma generating space and etching characteristics.

FIGS. 10A and 10B are graphs illustrating other exemplary relationships between the distance of plasma generating space and etching characteristics. In FIG. 10A, the horizontal axis indicates an in-plane position of the wafer W in an X-axis direction, and the vertical axis indicates the amount of etching. In FIG. 10B, the horizontal axis indicates an in-plane position of the wafer W in the Y-axis direction, and the vertical axis indicates the amount of etching. Here, the Y-axis direction indicates a direction from the center of rotation of the rotary table 2 toward the center of the wafer W in the plane of the wafer W, and the X-axis direction indicates a direction that passes through the center of the wafer W and is orthogonal to the Y-axis direction in the plane of the wafer W. Also in FIGS. 10A and 10B, rhomboidal marks represent data points in case 2-1 (30 mm), and triangular marks represent data points in case 2-2 (90 mm).

As illustrated by FIGS. 10A and 10B, the amount of etching in the plane of the Wafer W in case 2-2 (90 mm) is more uniform than that in case 2-1 (30 mm).

The above results indicate that, within the range of this example, the slimming process can be performed uniformly at a sufficient etching rate by setting the distance of plasma generating space at a large value, i.e., at 90 mm. Also, the above results indicate that the distance of plasma generating space can be used as a control knob of etching characteristics.

EXAMPLE 3

An experiment was performed to confirm that the amount of etching and the uniformity of etching can be adjusted by changing the pressure in the vacuum chamber 1.

A trench pattern (resist pattern) of a photoresist film (a film including carbon) was formed beforehand on a silicon wafer W with a diameter (φ) of 300 mm, and a slimming (etching) process was performed on the wafer W under the following slimming conditions.

Slimming Conditions

Plasma processing gas: Ar gas, $O_2$ gas, and $NH_3$ gas

Pressure in vacuum chamber 1: 1.5 Torr (case 3-1), 1.8 Torr (case 3-2), and 2.0 Torr (case 3-3)

*Other conditions were the same for cases 3-1 through 3-3.

Figure 11:
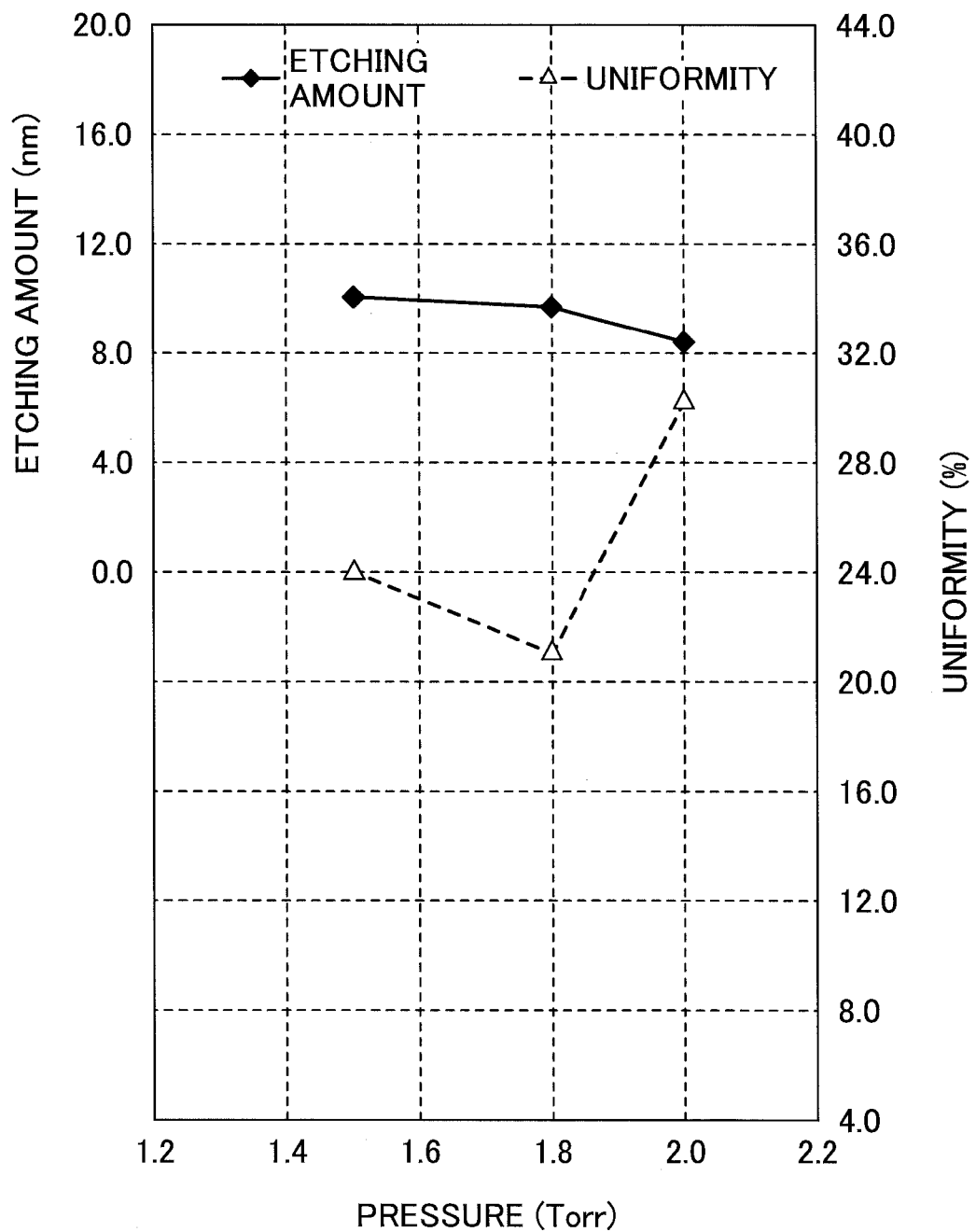
FIG. 11 is a graph illustrating an exemplary relationship between a pressure in a vacuum chamber and etching characteristics.

FIG. 11 is a graph illustrating an exemplary relationship between the pressure in the vacuum chamber 1 and etching characteristics. In FIG. 11, the horizontal axis indicates a pressure in the vacuum chamber 1, the left vertical axis indicates the amount of etching, and the right vertical axis indicates WIW uniformity. Also in FIG. 11, rhomboidal marks represent data points indicating the amount of etching, and triangular marks represent data points indicating uniformity.

As illustrated by FIG. 11, the amount of etching increases as the pressure in the vacuum chamber 1 decreases.

Also as illustrated by FIG. 11, within the range of this example, the uniformity is excellent in case 3-2 (pressure=1.8 Torr).

Figure 12A:
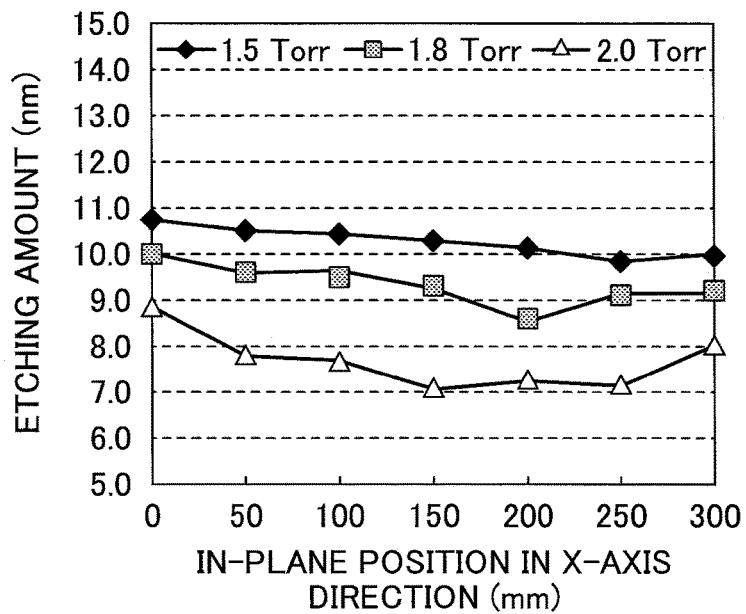
FIG. 12A is a graph illustrating another exemplary relationship between a pressure in a vacuum chamber and etching characteristics.
Figure 12B:
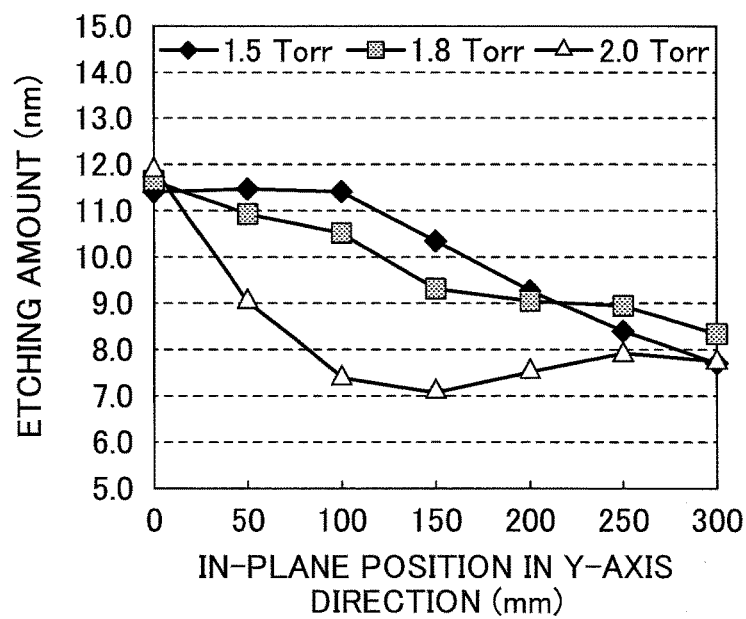
FIG. 12B is a graph illustrating another exemplary relationship between a pressure in a vacuum chamber and etching characteristics.

FIGS. 12A and 12B are graphs illustrating other exemplary relationships between the pressure in the vacuum chamber 1 and etching characteristics. In FIG. 12A, the horizontal axis indicates an in-plane position of the wafer W in the X-axis direction, and the vertical axis indicates the amount of etching. In FIG. 12B, the horizontal axis indicates an in-plane position of the wafer W in the Y-axis direction, and the vertical axis indicates the amount of etching. Also in FIGS. 12A and 12B, rhomboidal marks represent data points in case 3-1 (pressure=1.5 Torr), square marks represent data points in case 3-2 (pressure=1.8 Torr), and triangular marks represent data points in case 3-3 (pressure=2.0 Torr).

As illustrated by FIGS. 12A and 12B, within the range of this example, the uniformity of etching in the X-axis direction improves as the pressure in the vacuum chamber 1 decreases.

The above results indicate that, within the range of this example, the amount and uniformity of etching can be controlled by changing the pressure in the vacuum chamber 1. That is, the above results indicate that the pressure in the vacuum chamber 1 can be used as a control knob of etching characteristics.

EXAMPLE 4

An experiment was performed to confirm that the amount of etching and the uniformity of etching can be adjusted by changing the rotational speed of the rotary table 2.

A trench pattern (resist pattern) of a photoresist film (a film including carbon) was formed beforehand on a silicon wafer W with a diameter ($\varphi$) of 300 mm, and a slimming (etching) process was performed on the wafer W under the following slimming conditions.
Slimming Conditions
  Plasma processing gas: Ar gas, $O_2$ gas, and $NH_3$ gas
  Rotational speed of rotary table 2: 20 rpm (case 4-1), 60 rpm (case 4-2), 180 rpm (case 4-3), and 240 rpm (case 4-4).
  *Other conditions were the same for cases 4-1 through 4-4.

Figure 13:
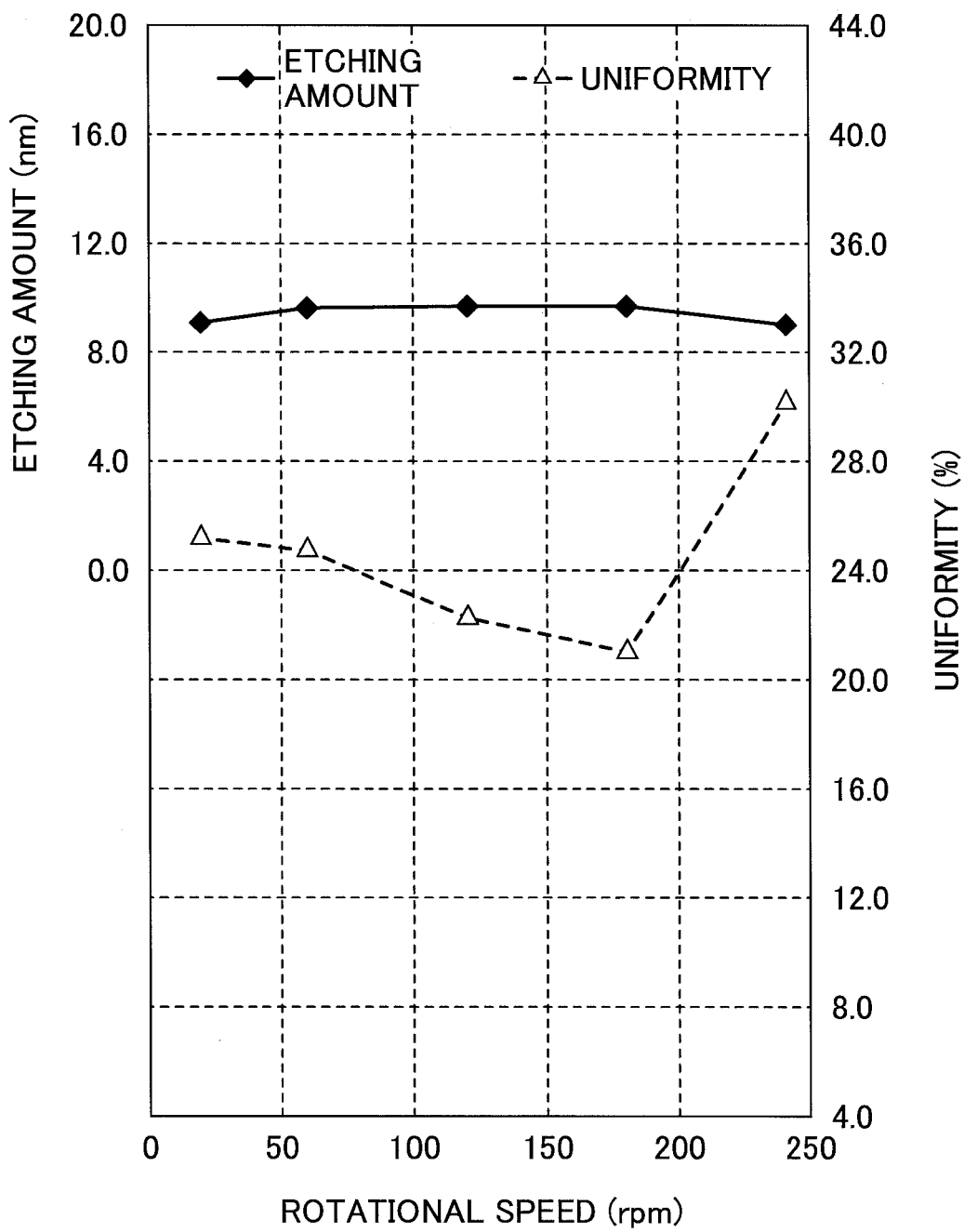
FIG. 13 is a graph illustrating an exemplary relationship between a rotational speed of a rotary table and etching characteristics.

FIG. 13 is a graph illustrating an exemplary relationship between the rotational speed of the rotary table 2 and etching characteristics. In FIG. 13, the horizontal axis indicates a rotational speed of the rotary table 2, the left vertical axis indicates the amount of etching, and the right vertical axis indicates WIW uniformity. Also in FIG. 13, rhomboidal marks represent data points indicating the amount of etching, and triangular marks represent data points indicating uniformity.

As illustrated by FIG. 13, the amount of etching does not greatly change depending on the rotational speed of the rotary table 2.

Also as illustrated by FIG. 13, within the range of this example, the uniformity is best in case 3-2 (rotational speed=180 rpm), but the overall trend is that the in-plane distribution improves as the rotational speed decreases.

Figure 14A:
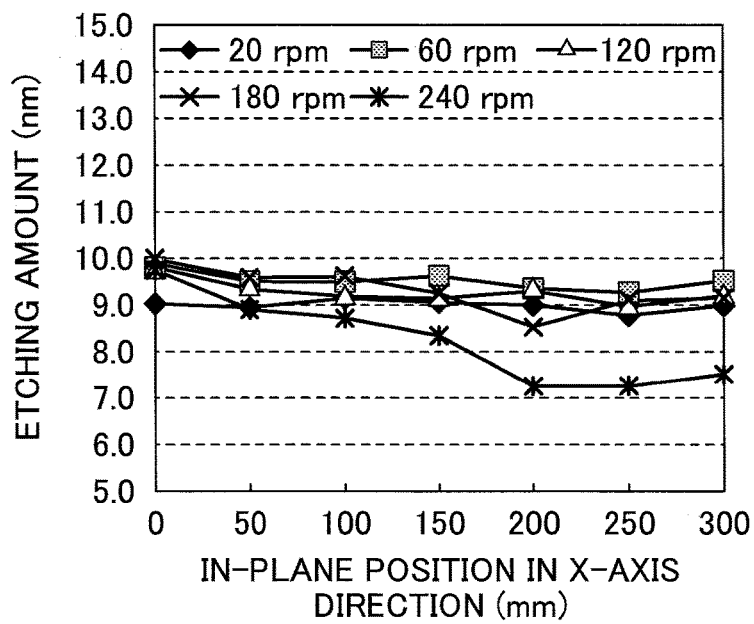
FIG. 14A is a graph illustrating another exemplary relationship between a rotational speed of a rotary table and etching characteristics.
Figure 14B:
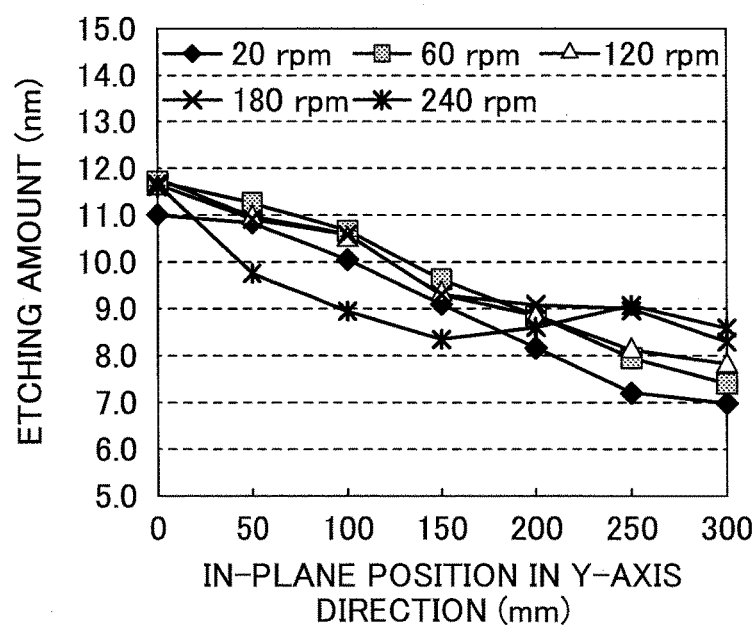
FIG. 14B is a graph illustrating another exemplary relationship between a rotational speed of a rotary table and etching characteristics.

FIGS. 14A and 14B are graphs illustrating other exemplary relationships between the rotational speed of the rotary table 2 and etching characteristics. In FIG. 14A, the horizontal axis indicates an in-plane position of the wafer W in the X-axis direction, and the vertical axis indicates the amount of etching. In FIG. 14B, the horizontal axis indicates an in-plane position of the wafer W in the Y-axis direction, and the vertical axis indicates the amount of etching. Also in FIGS. 14A and 14B, rhomboidal marks represent data points in case 4-1 (rotational speed=20 rpm), square marks represent data points in case 4-2 (rotational speed=60 rpm), triangular marks represent data points in case 4-3 (rotational speed=180 rpm), and X marks represent data points in case 4-4 (rotational speed=240 rpm).

As illustrated by FIGS. 14A and 14B, within the range of this example, the uniformity of etching in the X-axis direction improves as the rotational speed of the rotary table 2 decreases. On the other hand, the uniformity of etching in the Y-axis direction improves as the rotational speed of the rotary table 2 increases The above results indicate that, within the range of this example, the amount and uniformity of etching can be controlled by changing the rotational speed of the rotary table 2. That is, the above results indicate that the rotational speed of the rotary table 2 can be used as a control knob of etching characteristics.

EXAMPLE 5

An experiment was performed to confirm that the amount of etching and the uniformity of etching can be adjusted by changing the output level of the high-frequency power source 85.

A trench pattern (resist pattern) of a photoresist film (a film including carbon) was formed beforehand on a silicon wafer W with a diameter ($\varphi$) of 300 mm, and a slimming (etching) process was performed on the wafer W under the following slimming conditions.
Slimming Conditions
  Plasma processing gas: Ar gas, $O_2$ gas, and $NH_3$ gas
  Output level of high frequency power source 85: 1200 W (case 5-1), 2400 W (case 5-2), and 3600 W (case 5-3).
  *Other conditions were the same for cases 5-1 through 5-3.

Figure 15:
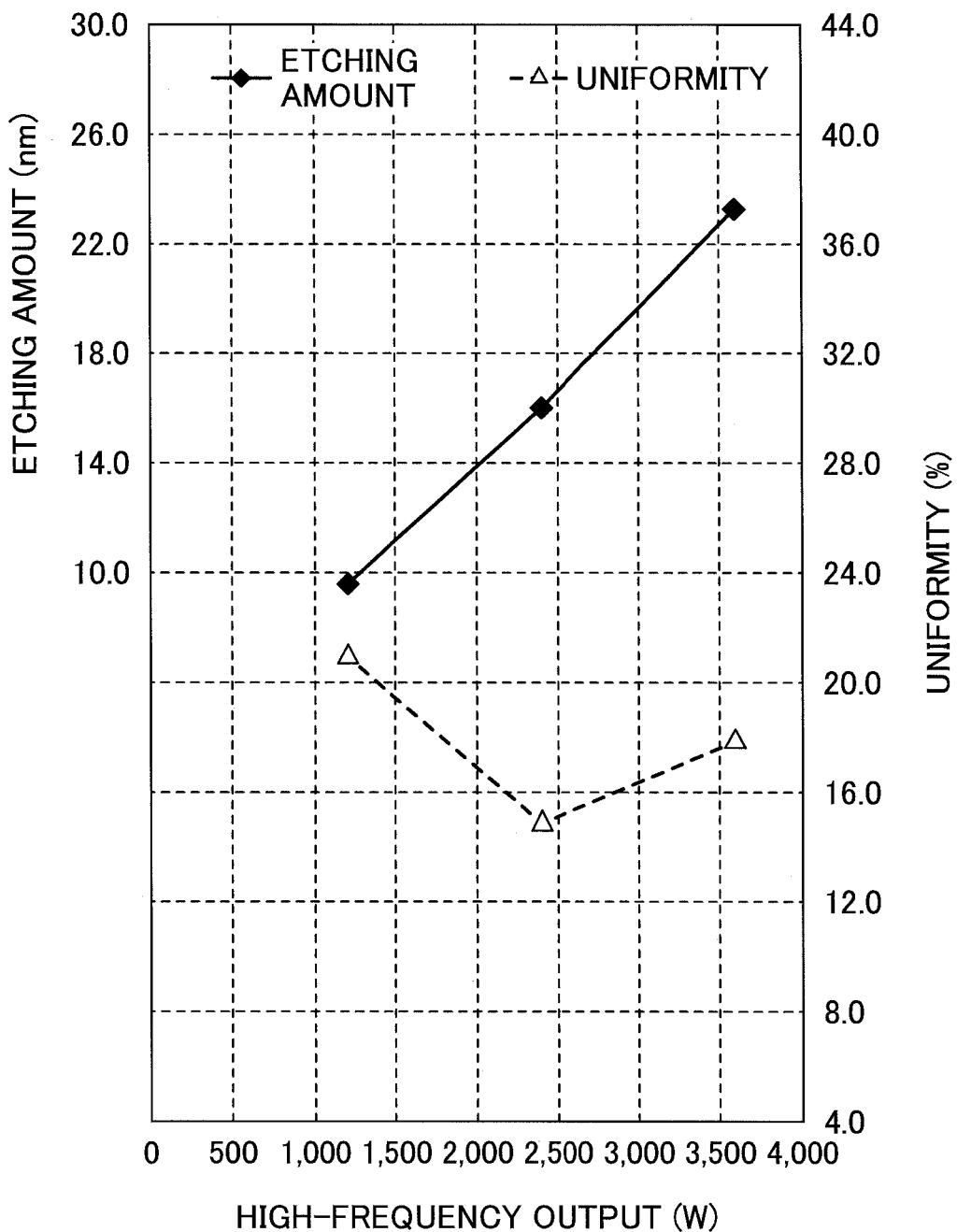
FIG. 15 is a graph illustrating an exemplary relationship between an output of a high-frequency power source and etching characteristics.

FIG. 15 is a graph illustrating an exemplary relationship between the output level of the high-frequency power source 85 and etching characteristics. In FIG. 15, the horizontal axis indicates an output level of the high-frequency power source 85, the left vertical axis indicates the amount of etching, and the right vertical axis indicates WIW uniformity. Also in FIG. 15, rhomboidal marks represent data points indicating the amount of etching, and triangular marks represent data points indicating uniformity.

As illustrated by FIG. 15, the etching rate increases as the output level of the high-frequency power source 85 increases.

Also as illustrated by FIG. 15, within the range of this example, the uniformity is best in case 5-2 (output level=2400 W).

Figure 16A:
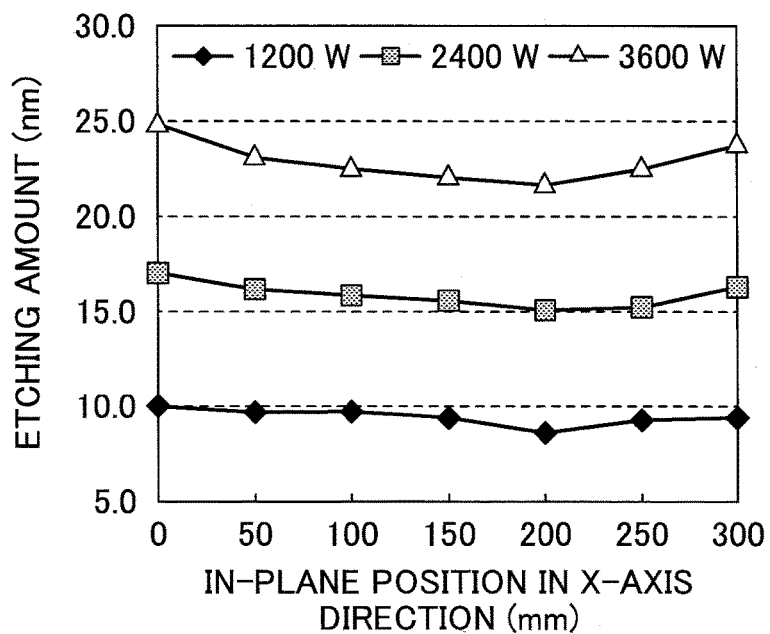
FIG. 16A is a graph illustrating another exemplary relationship between an output of a high-frequency power source and etching characteristics.
Figure 16B:
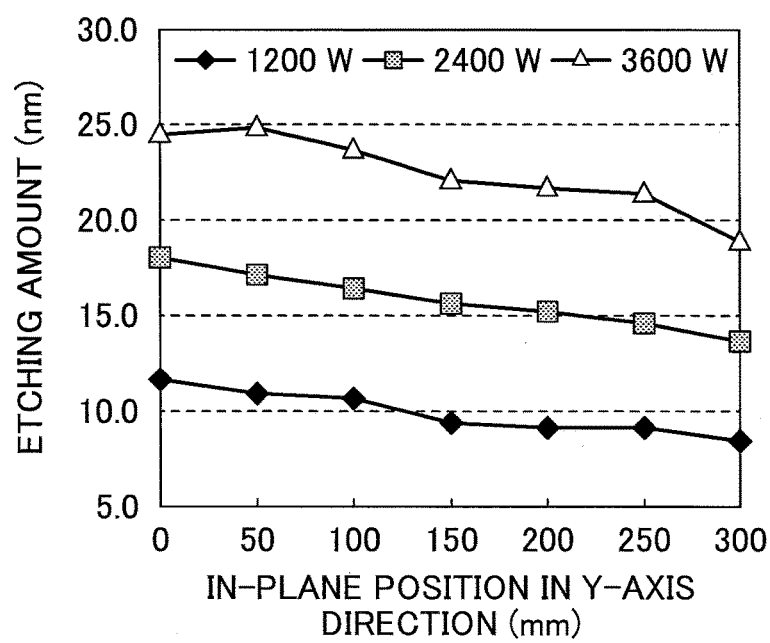
FIG. 16B is a graph illustrating another exemplary relationship between an output of a high-frequency power source and etching characteristics.

FIGS. 16A and 16B are graphs illustrating other exemplary relationships between the output level of the high-frequency power source 85 and etching characteristics. In FIG. 16A, the horizontal axis indicates an in-plane position of the wafer W in the X-axis direction, and the vertical axis indicates the amount of etching. In FIG. 16B, the horizontal axis indicates an in-plane position of the wafer W in the Y-axis direction, and the vertical axis indicates the amount of etching. Also in FIGS. 16A and 16B, rhomboidal marks represent data points in case 5-1 (output level=1200 W), square marks represent data points in case 5-2 (output level=2400 W), and triangular marks represent data points in case 5-3 (output level=3600 W).

As illustrated by FIGS. 16A and 16B, within the range of this example, the uniformity of etching in the X-axis direction and the Y-axis direction is not dependent on the output level of the high-frequency power source 85.

The above results indicate that, within the range of this example, the amount and uniformity of etching can be controlled by changing the output level of the high-frequency power source 85. That is, the above results indicate that the output level of the high-frequency power source 85 can be used as a control knob of etching characteristics.

As described above, according to the substrate processing method of the present embodiment, the distance of plasma generating space, the pressure in the vacuum chamber 1, the rotational speed of the rotary table 2, and the output level of the high-frequency power source 85 can be used as control knobs of etching characteristics. However, other parameters such as the type of a process gas, the flow rate of a process gas, and the process temperature can also be used as control knobs of etching characteristics.

An aspect of this disclosure provides a rotary-table substrate processing apparatus and a substrate processing method that make it possible to form a desired film.

A substrate processing apparatus and a substrate processing method according to the embodiment of the present invention are described above. However, the present invention is not limited to the specifically disclosed embodiment, and variations and modifications may be made without departing from the scope of the present invention.

What is claimed is:

1. A substrate processing apparatus, comprising:
a vacuum chamber including a top plate;
a rotary table rotatably disposed in the vacuum chamber and including a substrate mounting area on which a substrate is to be placed, the substrate mounting area being formed on a surface of the rotary table that faces the top plate;
a first process gas supply part that is disposed between the top plate and the rotary table and supplies a first process gas to be adsorbed on a surface of the substrate;
a plasma processing gas supply part that is disposed between the top plate and the rotary table apart from the first process gas supply part in a circumferential direction of the rotary table, and supplies a second process gas to the surface of the substrate;
a separation gas supply part that is disposed between the top plate and the rotary table and between the first process gas supply part and the plasma processing gas supply part, and supplies a separation gas for separating the first process gas and the second process gas;
a plasma generator that converts the second process gas into plasma;
a ring-shaped part hermetically attached to a periphery of an opening formed in the top plate; and
a housing that is arranged so as to directly face the rotary table and hermetically attached to an inner circumferential surface of the ring-shaped part and houses the plasma generator,
wherein the ring-shaped part is a separate structure from the top plate and a sealing part is provided between the ring-shaped part and the housing, and
wherein the ring-shaped part includes a bellows structure, as a part of an elevating mechanism, provided above the substrate mounting area and configured to change a height of the ring-shaped part and the housing to change a distance between the plasma generator and the rotary table.

2. The substrate processing apparatus as claimed in claim 1, wherein
the rotary table is rotatably attached to a shaft part that includes a second bellows structure; and
the elevating mechanism changes a height of the rotary table via the second bellows structure to change a distance between the plasma generator and the rotary table.

3. The substrate processing apparatus as claimed in claim 1, wherein the plasma generator includes
an antenna that converts the second process gas into the plasma by inductive coupling;
a high-frequency power source that applies high-frequency power to the antenna; and
a Faraday shield that is disposed between the antenna and a housing for housing the plasma generator, and includes a plate-like part in which multiple slits are formed to prevent an electric field component of an electromagnetic field generated around the antenna from passing through the Faraday shield and to allow a magnetic field component of the electromagnetic field to pass through the Faraday shield, the slits extending in a direction orthogonal to the antenna and being arranged along a direction that the antenna extends.

4. The substrate processing apparatus as claimed in claim 1, wherein a height of a surface of the top plate from the rotary table in a separation area where the separation gas is supplied is lower than a height of the surface of the top plate from the rotary table in a process area where the first process gas is supplied.

5. The substrate processing apparatus as claimed in claim 1, wherein the bellows structure is configured to move the housing and the plasma generator upward and downward by moving the ring-shaped part.

6. The substrate processing apparatus as claimed in claim 1, wherein the sealing part comprises an O-ring.

7. The substrate processing apparatus as claimed in claim 1, wherein the bellows structure is provided in a space between the ring-shaped part and the top plate.

8. The substrate processing apparatus as claimed in claim 1, further comprising a pressing part that has a frame shape extending along an entire circumference of the housing and configured to press the housing toward the rotary table.

* * * * *